(12) United States Patent
Gamo et al.

(10) Patent No.: US 8,420,043 B2
(45) Date of Patent: Apr. 16, 2013

(54) NANO-CRYSTAL DIAMOND FILM, MANUFACTURING METHOD THEREOF, AND DEVICE USING NANO-CRYSTAL DIAMOND FILM

(75) Inventors: Hidenori Gamo, Tokyo (JP); Toshihiro Ando, Tsukuba (JP)

(73) Assignees: Toppan Printing Co., Ltd., Tokyo (JP); National Institute for Materials Science, Tsukuba (JP)

( * ) Notice: Subject to any disclaimer, the term of this patent is extended or adjusted under 35 U.S.C. 154(b) by 1102 days.

(21) Appl. No.: 11/598,680

(22) Filed: Nov. 14, 2006

(65) Prior Publication Data
US 2010/0084634 A1 Apr. 8, 2010

Related U.S. Application Data

(63) Continuation of application No. PCT/JP2004/007642, filed on May 27, 2004.

(51) Int. Cl.
*B01J 2/00* (2006.01)
*B01J 3/06* (2006.01)
*H01M 2/00* (2006.01)
*H05H 1/24* (2006.01)
*B32B 5/16* (2006.01)
*G01N 27/26* (2006.01)
*G01N 15/06* (2006.01)
*H01L 31/00* (2006.01)
*H01L 29/08* (2006.01)
*H01L 29/04* (2006.01)
*H01L 29/10* (2006.01)

(52) U.S. Cl.
USPC ........... 423/446; 502/180; 427/569; 428/323; 204/400; 422/68.1; 136/252; 257/40; 257/51

(58) Field of Classification Search .................. None
See application file for complete search history.

(56) References Cited

U.S. PATENT DOCUMENTS 5,070,274 A * 12/1991 Yoshikawa et al. ...... 315/111.21
5,633,513 A 5/1997 Koyama et al.
(Continued)

FOREIGN PATENT DOCUMENTS

JP 2-233590 9/1990
JP 2001-7385 1/2001
(Continued)

OTHER PUBLICATIONS

Show et al.; Characterization and Electrochemical Responsiveness of Boron-Doped Nanocrystalline Diamond Thin Film; Chem. Mater.; 15, 879-888; 2003.*

(Continued)

*Primary Examiner* — Melvin C Mayes
*Assistant Examiner* — Guinever Gregorio

(57) ABSTRACT

A nano-crystal diamond film synthesized on a substrate and containing, as a major component, nano-crystal diamond having a grain diameter from 1 nm to less than 1000 nm. This nano-crystal diamond film can be formed on a substrate by means of a plasma CVD method using a raw material gas containing a hydrocarbon and hydrogen, allowing the formation of the nano-crystal diamond film to take place outside the plasma region. This nano-crystal diamond film is applicable to the manufacture of an electrochemical device, an electrochemical electrode, a DNA chip, an organic electroluminescent device, an organic photoelectric receiving device, an organic thin film transistor, a cold electron-emission device, a fuel cell and a catalyst.

21 Claims, 7 Drawing Sheets

U.S. PATENT DOCUMENTS

| | | |
|---|---|---|
| 5,795,672 A | 8/1998 | Dearnaley |
| 6,383,288 B1 | 5/2002 | Hayashi et al. |

FOREIGN PATENT DOCUMENTS

| | | |
|---|---|---|
| JP | 2001-226194 | 8/2001 |
| JP | 2001226194 A * | 8/2001 |
| JP | 2001-348296 | 12/2001 |
| JP | 2002-66302 | 3/2002 |
| JP | 2003-125764 | 5/2003 |
| JP | 2004-35908 | 2/2004 |
| WO | WO 02/31891 A1 | 4/2002 |

OTHER PUBLICATIONS

Durrant et al.; Characterization of Diamond Fluorinated by Glowing Discharge Plasma Treatment; Diamond and Related Materials; 10, 490-495; 2001.*

Ramesham; Effects of annealing and Hydrogen Plasma Treatment on the Voltammetric and Impedance Behavior of the Diamond Electrode; Thin Solid Films; 315, 222-228; 1998.*

International Preliminary Report on Patentability, mailed Dec. 7, 2006, and issued in corresponding International Patent Application No. PCT/JP2004/007642.

Show Y. et al., "Characterization and electrochemical responsiveness of boron-doped nanocrystalline diamond thin-film electrodes", Chemistry of Materials, vol. 15, No. 4, Feb. 2003, pp. 879-888, American Chem. Soc.

European Search Report mailed Aug. 20, 2009 and issued in corresponding European Patent Application 04735108.5.

S. Bhattacharyya et al., "Synthesis and characterization of highly-conducting nitrogen-doped ultrananocrystalline diamond films", *Applied Physics Letters*, vol. 79, No. 10, Sep. 3, 2001, pp. 1441-1443.

International Search Report (Form PCT/ISA/210) dated Sep. 14, 2004 of International Application No. PCT/JP2004/007642.

Gupta S. et al., "Influence of sulfur incorporation on field-emissions properties of microcrystalline diamond thin films", Journal of Materials Research, vol. 18, No. 11, Nov. 2003, pp. 2708-2716, Materials Research Society.

Gupta S. et al., "Ex situ spectroscopic ellipsometry investigations of chemical vapor deposited nanocomposite carbon thin films", Thin Solid Films, vol. 455-456, Feb. 12, 2004, pp. 422-428.

Gupta S. et al., "Electron filed emissions from sulfur-incorporated nanocrystalline carbon thin films", Applied Physics Letters, vol. 79, No. 21, Nov. 19, 2001, pp. 3446-3448, American Institute of Pyhsics, Melville, NY.

Köck F. A. M. et al., "Spatial distribution of electron emission sites for sulfur doped and intrinsic nanocrystalline diamond films", Diamond and Related Materials, vol. 12, No. 3-7, Mar. 1, 2003, pp. 474-480.

Ferro S. et al., "Physicochemical properties of fluorinated diamond electrodes", Journal of Physical Chemistry B, vol. 107, No. 31, Aug. 7, 2003, pp. 7567-7573.

European Office Action dated Apr. 29, 2010 and issued in corresponding European Patent Application 04 735 108.5.

Japanese Office Action issued Nov. 24, 2010 in corresponding Japanese Patent Application 2006-513796.

European Search Report dated Oct. 20, 2011 issued in corresponding European Patent Application No. 11169512.8.

Wensha Yang et al., "Preparation and Electrochemical Characterization of DNA-modified Nanocrystalline Diamond Films", Materials Research Society Symposium, vol. 737 (2003) pp. F4.4.1-4.4.6.

A. Tsumura et al., "Macromolecular electronic device: Field-effect transistor with a polythiophene thin film", Applied Physics Letters, vol. 49 No. 18 (Nov. 3, 1986) pp. 1210-1212.

Ming-Seung Chun, "Interface formation and properties of alpha-NPD thermally deposited on CVD diamond films", Applied Surface Science, vol. 216 No. 1-4 (2003) pp. 106-112.

Z.Q. Ma et al., "Boron-doped diamond-like amorphous carbon as photovoltaic films in solar cell", Solar Energy Materials & Solar Cells, vol. 69 No. 4 (Apr. 5, 2000) pp. 339-344.

W. A. Yarbrough. et al., "Diamond deposition at low substrate temperatures", Journal of Crystal Growth, vol. 99, No. 1-4, Jan. 1990, pp. 1177-1182, Elsevier, Amsterdam.

European Search Report dated Jul. 29, 2011 and issued in corresponding European Patent Application 11169512.8.

Taiwan Office Action dated Feb. 14, 2012 issued in corresponding Taiwan Patent Application No. 093114864.

* cited by examiner

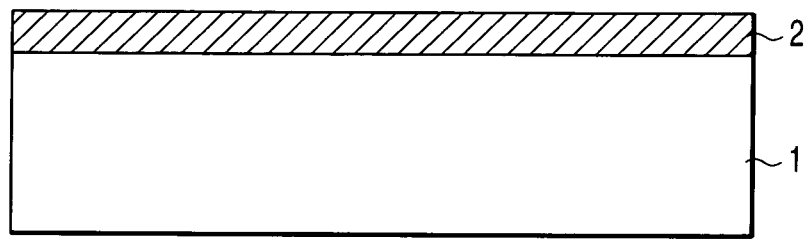
F I G. 1
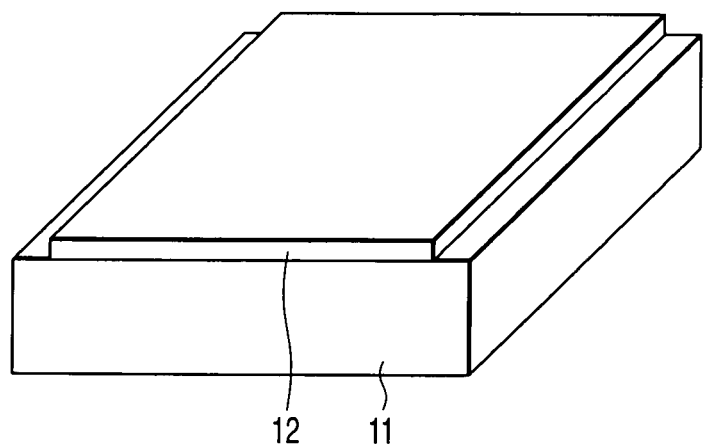
F I G. 2 A
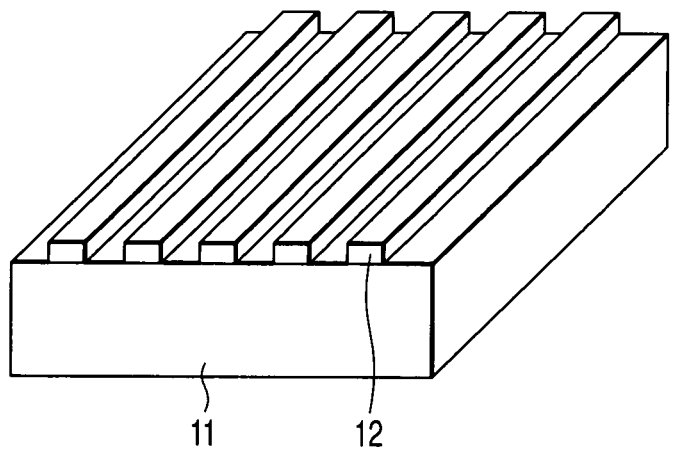
F I G. 2 B

NANO-CRYSTAL DIAMOND FILM, MANUFACTURING METHOD THEREOF, AND DEVICE USING NANO-CRYSTAL DIAMOND FILM

CROSS REFERENCE TO RELATED APPLICATIONS

This is a Continuation Application of PCT Application No. PCT/JP2004/007642, filed May 27, 2004, which was published under PCT Article 21(2) in Japanese.

BACKGROUND OF THE INVENTION

1. Field of the Invention

This invention relates to a nano-crystal diamond film formed of fine diamond crystal of the order of nanometers. This invention also relates to a method of manufacturing such a nano-crystal diamond film and to various kinds of devices using such a nano-crystal diamond film.

2. Description of the Related Art

A type of diamond in which carbon atoms are bonded to each other through covalent bond by way of sp3 hybrid orbital is widely known to have, due to its high bonding energy, specific physical properties that cannot be derived from other kinds of materials. In recent years, it has been made possible to synthesize a film-like diamond (diamond film) of high quality at low temperatures by making use of a chemical vapor-phase deposition method (CVD method). In this film-forming method, a thermal filament CVD method or a microwave CVD method is generally employed.

According to these methods of forming a diamond film, it is possible to form a monocrystalline diamond film as a homoepitaxial film on a diamond substrate (natural or high-pressure synthetic diamond). On the other hand, it is also possible to form a polycrystalline diamond film on a silicon, metal or quartz substrate.

Although it is certainly possible to synthesize a monocrystalline diamond film of high quality on a diamond substrate, it is required to employ, as a substrate, natural diamond or high-temperature/high-pressure synthetic diamond. In this case, the size of the substrate is limited at most to about 10 mm×10 mm at present.

On the other hand, a polycrystalline diamond film can be formed on a substrate of relatively large size using silicon. However, since the diamond film to be obtained is a polycrystal, the surface of diamond film is highly rough. Namely, since the grain diameter of crystal particles constituting the polycrystalline diamond film is as large as 1-10 μm, the surface of diamond film is caused to become prominent in roughness.

Furthermore, since it is required to heat a substrate up to a high temperature of 800° C. or more in the synthesis of both a homoepitaxial film and polycrystalline diamond film, it is considered necessary to employ a high heat-resistant substrate such as expensive diamond, single crystal silicon or quartz. Therefore, it is impossible to employ a substrate which is suited for forming a diamond film of large area at low cost such as a glass substrate or a polymer substrate to be used for a display for example.

As described above, all of the conventional diamond films are not suited for practical use because of the cost of the substrate material and of the difficulties to increase the size thereof.

Under the circumstances, it is now desired to develop a nano-crystal diamond film which is formed of fine crystal grains of the order of nanometers and hence is smooth in surface, and which can be formed at low temperatures on a substrate having a large surface area and made of one of various kinds of materials. However, no one has succeeded, as yet, in discovering such a film and a method of forming such a film.

Incidentally, there is known a technique of manufacturing diamond having a particle diameter ranging from 20 to 50 nm, wherein carbon nanotubes are treated at a high temperature of 1600° C. or more under a high pressure of 10 GPa or more to manufacture the diamond. However the product thus prepared is not in the form of film but merely in the form of particles (for example, JP Patent Laid-open Publication (Kokai) No. 2002-66302).

Objects of the present invention are to provide a nano-crystal diamond film which is formed of fine crystal grains of the order of nanometers and hence is smooth in surface, and which can be formed on substrates of various kinds of materials at a temperature specifically suited for each of the substrates, and also to provide a method for manufacturing the nano-crystal diamond film.

BRIEF SUMMARY OF THE INVENTION

According to a first aspect of the present invention, there is proposed a nano-crystal diamond film synthesized on a substrate and containing, as a major component, nano-crystal diamond having a grain diameter from 1 nm to less than 1000 nm.

According to a second aspect of the present invention, there is proposed an electrochemical device comprising one or more pairs of electrodes to detect the kind of test substance to be measured by taking advantage of a redox reaction of a surface of electrodes and to measure the concentration of the test substance, wherein at least one of the electrodes comprises a substrate, and the aforementioned nano-crystal diamond film formed on a surface of the substrate.

According to a third aspect of the present invention, there is proposed an electrochemical electrode to be employed as an anode and/or a cathode for electrolyzing liquid or gas by taking advantage of an electrochemical reaction, wherein the anode and/or the cathode comprises a substrate, and the aforementioned nano-crystal diamond film is formed on a surface of the substrate.

According to a fourth aspect of the present invention, there is proposed a DNA chip comprising a substrate, the aforementioned nano-crystal diamond film formed on a surface of the substrate and having, on a surface thereof, a functional group for carrying DNA, and a DNA probe carried on the aforementioned nano-crystal diamond film.

According to a fifth aspect of the present invention, there is proposed an organic electroluminescent device comprising a substrate on which a first electrode, a hole transport layer, an organic luminescent layer, an electron transport layer, and a second electrode are successively laminated, wherein the first electrode and/or the second electrode is in contact with the hole transport layer or with the electron transport layer and comprises the aforementioned nano-crystal diamond film.

According to a sixth aspect of the present invention, there is proposed an organic photoelectric receiving device comprising a substrate on which a first electrode, a first conductive organic semiconductor layer, a second conductive organic semiconductor layer, and a second electrode are successively laminated, wherein the first electrode and/or the second electrode is in contact with the first conductive organic semiconductor layer or with the second conductive organic semiconductor layer and comprises the aforementioned nano-crystal diamond film.

According to a seventh aspect of the present invention, there is proposed an organic thin film transistor comprising a substrate, a gate electrode formed on the substrate, a gate insulating film covering the gate electrode, a source electrode and a drain electrode spaced apart from each other, and an organic semiconductor layer covering the space between the source electrode and the drain electrode, wherein the surface of the source electrode and/or the drain electrode is provided with the aforementioned nano-crystal diamond film.

According to a seventh aspect of the present invention, there is proposed a cold electron-emission device comprising a substrate, a conductive layer formed on the substrate, an insulating layer and a gate electrode both formed on the conductive layer and provided with an opening, and an emitter formed on a portion of the conductive layer which is exposed through the opening, wherein the surface of the emitter is provided with the aforementioned nano-crystal diamond film.

According to an eighth aspect of the present invention, there is proposed a fuel cell comprising a first electrode, a second electrode, and an electrolyte layer sandwiched between the first electrode and the second electrode, wherein a side face of the first electrode and/or the second electrode, which is in contact with the electrolyte layer, is formed with the aforementioned nano-crystal diamond film carrying thereon a catalyst.

According to a ninth aspect of the present invention, there is proposed a metal-carrying nano-crystal diamond catalyst comprising a carrier formed of the aforementioned nano-crystal diamond film, and catalytic metal particles carried on the carrier and having a particle diameter of the order of nanometers.

According to a tenth aspect of the present invention, there is proposed a method for manufacturing a nano-crystal diamond film, the method comprising a step of forming a nano-crystal diamond film on a substrate by means of a plasma CVD method using a raw material gas comprising hydrocarbon and hydrogen, the formation of the nano-crystal diamond film being taken place outside plasma region.

BRIEF DESCRIPTION OF THE SEVERAL VIEWS OF THE DRAWING

FIG. 1 is a cross-sectional view showing a nano-crystal diamond film according to one aspect of the present invention;

FIG. 2A is a perspective view showing a main portion of an electrode terminal of an electrochemical device according to another aspect of the present invention;

FIG. 2B is a perspective view showing a pattern of the electrode of an electrochemical device according to a further aspect of the present invention;

DETAILED DESCRIPTION OF THE INVENTION

Figure 3A:
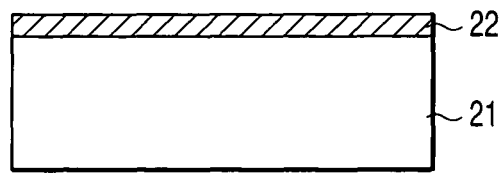
FIGS. 3A-3E are cross-sectional views each illustrating the manufacturing process of a main portion of electrode terminal of an electrochemical device according to a further aspect of the present invention.

The nano-crystal diamond film of the present invention is formed of crystal grains each having a grain diameter of the order of nanometers. However, since each of these nano-particles is formed of diamond crystal, the nano-particles are enabled to exhibit the same physical properties as those of monocrystal diamond or polycrystal diamond. Namely, the nano-crystal diamond film is capable of exhibiting properties which are inherently peculiar to natural diamond even though the crystal thereof is of nano-size.

Further, this nano-crystal diamond film can be doped with impurity elements and hence is enabled to control the semiconductor properties thereof depending on the kinds and quantity of dopant. Further, this nano-crystal diamond film can be effectively surface-treated, thus making it possible to modify the surface properties thereof through the attachment thereto of various kinds of functional groups.

The nano-crystal diamond film of the present invention can be doped with an impurity. As for the impurity, it is preferable to employ at least one kind of material selected from the group consisting of sulfur, boron, oxygen, phosphorus, nitrogen and silicon.

Depending on the kind of impurity to dope, the nano-crystal diamond film may exhibit n-type or p-type impurity conductivity as well as semiconductor characteristics and also high electric conductivity.

As for the substrate on which the nano-crystal diamond film of the present invention is to be formed, it is possible to employ at least one kind of substrate selected from the group consisting of a silicon substrate, a quartz substrate, a ceramic substrate, a metal substrate, a glass substrate and a polymer substrate. Namely, the nano-crystal diamond film of the present invention can be formed, as a film having almost the same physical properties as those of diamond, on a practical substrate other than a diamond substrate. For example, as for the practical substrate to be employed in a high-temperature process at a temperature ranging from 500° C. to 900° C., it is possible to employ a silicon substrate, a quartz substrate, a metal substrate or a ceramic substrate. On the other hand, as for the practical substrate to be employed in a low-temperature process at a temperature ranging from 300° C. to 500° C., it is possible to employ a glass substrate. Further, as for the practical substrate to be employed in a process at a temperature ranging from 100° C. to 300° C., it is possible to employ a polymer substrate.

The nano-crystal diamond film of the present invention may be formulated so as to have an electron-donating group-terminated surface. By imparting an electron-donating group-terminated structure to the surface of the nano-crystal diamond film, it is possible to impart electric conductivity to the surface of the film. Further, since the surface of the nano-crystal diamond film of the present invention is formed to have a low work function, it is possible to attain practical properties such as high electron-releasing property or electron injection property especially when this nano-crystal diamond film is applied to various kinds of electrode.

Further, the nano-crystal diamond film of the present invention may be formulated so as to have an electron-attractive group-terminated surface. By imparting an electron-attractive group-terminated structure to the surface of the nano-crystal diamond film, it is possible to enable the surface of the nano-crystal diamond film to have a high work function. Therefore, it is possible, especially when this nano-crystal diamond film is applied to various kinds of electrode, to attain practical properties such as high hole injection property.

Furthermore, when the nano-crystal diamond film of the present invention is terminated with a halogen atom such as fluorine atom or chlorine atom, the surface of nano-crystal diamond film is enabled to have a low friction coefficient, thereby making it possible to apply the nano-crystal diamond film to machine parts such as a micromachine and also to make the surface of nano-crystal diamond film hydrophobic or water-repellent.

The present invention also provides a method for manufacturing a nano-crystal diamond film, the method comprising a step of forming a nano-crystal diamond film on a substrate by means of a plasma CVD method using a raw material gas comprising a hydrocarbon and hydrogen, the formation of the nano-crystal diamond film being performed outside the plasma region.

In the method for manufacturing a nano-crystal diamond film according to the present invention, it is possible to obtain various kinds of nano-crystal diamond films differing in structure such as crystallinity, in conductivity and in semiconductor properties by controlling the ratio between the hydrocarbon and hydrogen in raw gas to be employed in the CVD method. Therefore, it is possible to easily control the physical properties of the film depending on the applications thereof.

Further, since the formation of film is performed outside the plasma region, the temperature for forming the film can be maintained at a lower temperature, thus making it possible to control the crystal grain diameter.

In this method of the present invention, the process of forming the film should preferably be carried out with the temperature of the substrate being confined within the range of 20° C. to not more than 900° C. Generally, the temperature for forming a monocrystalline or polycrystalline diamond film is set to not lower than 800° C. In the method of the present invention however, it is possible to greatly decrease the film-forming temperature. The diameter of the crystal grains constituting the nano-crystal diamond film can be controlled by controlling the temperature of substrate, thus making it possible to control the structure and physical properties of the film in various manners.

In this method of the present invention, the nano-crystal diamond film should preferably be formed by means of a microwave plasma CVD method. It is possible, through the employment of microwave plasma representing a high-density plasma source, to effectively decompose the hydrocarbon constituting the raw gas, thereby making it possible to improve the quality of film and the throughput of forming the film.

In this method of the present invention, the formation of a nano-crystal diamond film should preferably be carried out with a substrate being disposed on a downstream side of the reaction gas flow in a CVD chamber. When a substrate is disposed on a downstream side of the reaction gas flow, the injection of ion to the surface of substrate can be facilitated, thus making it possible to form a film of high quality.

In this method of the present invention, a raw gas may be mixed with at least one kind of additive gas selected from the group consisting of hydrogen sulfide or sulfur oxide, diborane, oxygen, carbon dioxide, phosphine, ammonia or nitrogen, and silane. It is possible, through the control of the kind and quantity of these additive gases, to obtain various kinds of nano-crystal diamond films differing in structure such as crystallinity, and in physical properties such as conductivity, thus facilitating the control of the physical properties of the film.

According to the method of the present invention, since the nano-crystal diamond film can be formed with the temperature of the substrate being selected from a wide range of 20° C. to 900° C., it is possible to use various kinds of substrate. Namely, the substrate to be employed in the method of the present invention may be selected from the group consisting of a silicon substrate, a quartz substrate, a ceramic substrate, a metal substrate, a glass substrate and a polymer substrate. According to the present invention, it is possible to form a nano-crystal diamond film having almost the same physical properties as those of diamond on a practical substrate other than a diamond substrate. For example, as for the practical substrate to be employed in a high-temperature process at a temperature ranging from 500° C. to 900° C., it is possible to employ a silicon substrate, a quartz substrate, a metal substrate or a ceramic substrate. On the other hand, as for the practical substrate to be employed in a low-temperature process at a temperature ranging from 300° C. to 500° C., it is possible to employ a glass substrate. Further, as for the practical substrate to be employed in a process at a temperature ranging from 100° C. to 300° C., it is possible to employ a polymer substrate.

According to the method of the present invention, the surface of nano-crystal diamond film may be subjected to a hydrogen plasma treatment by making use microwaves or high-frequency power after finishing the formation of the nano-crystal diamond film by means of plasma CVD. Due to this hydrogen plasma treatment, the surface of a nano-crystal diamond film can be terminated with hydrogen or an electron-donating group, thus making it possible to obtain a chemically very stable surface. Furthermore, it is also possible to obtain a surface which exhibits not only a high electric conductivity resulting from a surface conduction phenomenon but also a negative electron affinity, the surface also exhibiting a low work function.

According to the method of the present invention, the surface of a nano-crystal diamond film may be subjected to a plasma treatment by making use of a fluorinated or chlorinated gas and by means of microwaves or high-frequency power after finishing the formation of the nano-crystal diamond film by means of plasma CVD. Due to this halogenating plasma treatment, the surface of a nano-crystal diamond film can be terminated with a halogen atom or an electron-attractive group, thus making it possible to obtain a chemically very stable surface. Furthermore, it is also possible to obtain a surface which is low in friction coefficient and high in work function.

According to the method of the present invention, it is possible to form diamond of high quality on a practical substrate with the temperature of the substrate being selected from a wide range. Further, since the crystal grain is enabled to have a diameter of the order of nanometers, the surface of the nano-crystal diamond film to be obtained is smooth and flat, thus making it possible to manufacture a film which is suited for practical applications. Additionally, it is possible, according to the method of the present invention, to control the impurity and the surface features, thus making it possible to easily and highly controllably impart various functional properties suited for practical use to the surface of the nano-crystal diamond film.

Further, it is possible, through the control of impurity, to obtain semiconductor properties, thus rendering the nano-crystal diamond film applicable to a wide range of use as a diamond film having a high electron mobility and a high hole mobility. For example, the nano-crystal diamond film of the present invention can be used in various fields of applications using carbonaceous materials, for example, as a charged corpuscular-rays mask, a hard mask for lithography, a micromachine, a covering material for tools and magnetic heads, a cold cathode electron source, an electrode film for a thin display device such as an electroluminescent device and a liquid crystal display or an electrode film for a solar cell, a surface acoustic wave element, a biochip, an electrode for electrochemical reaction, and an electrode for a secondary cell or for a fuel cell.

Next, a nano-crystal diamond film according to one aspect of the present invention will be explained with reference to drawings.

FIG. 1 is a cross-sectional view illustrating the nano-crystal diamond film according to one embodiment of the present invention.

As for a supporting substrate (base body) 1, it is possible to employ a silicon substrate, a quartz substrate, a ceramic substrate, a metal substrate, a glass substrate or a polymer substrate.

The substrate shown in FIG. 1 is formed of a planar substrate. However, the substrate may be formed of a stereoscopic substrate such as a cylindrical substrate, a spherical substrate, etc.

The nano-crystal diamond film 2 formed on the substrate 1 includes diamond crystal grains each having a grain diameter ranging from 1 nm to not more than 1000 nm. If the diameter of the crystal grains of the nano-crystal diamond film is less than 1 nm, the grain boundary thereof would become too large due to the microcrystallinity thereof, or the amorphous component would become too large, thus failing to derive the properties peculiar to normal diamond. Further, if the diameter of the crystal grain of the nano-crystal diamond film is 1000 nm or more, the roughness of the surface of the film would become prominent, thus making the film unsuited for a working process such as patterning or for constructing a laminate structure with other kinds of materials, and therefore, such a film cannot be used for practical applications. A preferable range for the diameter of the crystal grain would be 1 nm to 100 nm.

Incidentally, it should not be construed that the nano-crystal diamond film of the present invention is strictly limited to those which do not include a crystal grain having a diameter of less than 1 nm or having a diameter of 1000 nm or more. Namely, even if a very small amount of crystal grains having a diameter of less than 1 nm or a very small amount of crystal grains having a diameter of 1000 nm or more is included in the nano-crystal diamond film, it is possible to substantially secure the effects of the present invention. In other words, what is required in the present invention is that not less than 80% of crystal grains in the nano-crystal diamond film should be constituted by crystal grains having a grain diameter ranging from 1 nm to not more than 1000 nm.

Further, the nano-crystal diamond film of the present invention may be doped with at least one kind of impurity selected especially from sulfur, boron, oxygen, nitrogen and silicon. When the nano-crystal diamond film is doped with these impurity, e.g. sulfur and nitrogen both functioning as a donor, or boron functioning as an acceptor, it is possible to enhance the conductivity of the film itself due to the conductivity of these impurity and also to derive semiconductor properties.

The concentration of an impurity to be doped into the nano-crystal diamond film may be suitably selected such that the properties of the nano-crystal diamond film would not be damaged by the impurity. For example, the concentration thereof may be selected from the range of $10^{16}$ to $10^{21}/cm^3$.

As for the thickness of the nano-crystal diamond film, there is not any particular limitation and hence it can be suitably selected depending on the application thereof.

Further, the surface of the nano-crystal diamond film may be terminated with an electron-donating group. As for the examples of the electron-donating group, they include H and OR (wherein R is H or alkyl group). When the surface of the nano-crystal diamond film is formulated to have such a surface chemisorption structure, it is possible to form a surface conductive layer and hence to realize high conductivity and at the same time, it is possible to obtain a nano-crystal diamond film having a surface exhibiting a negative electron affinity and a low work function.

As for the method of obtaining a nano-crystal diamond film whose surface is terminated with H, it is possible to employ a method wherein a nano-crystal diamond film is formed by means of plasma CVD method and then the surface thereof is subjected to a hydrogen plasma treatment. As for the method of obtaining a nano-crystal diamond film whose surface is terminated with OR, it is possible to employ a method wherein a nano-crystal diamond film is formed by means of the plasma CVD method and then the surface thereof is treated by means of the Williamson method.

On the other hand, the surface of the nano-crystal diamond film may be terminated with an electron-attractive group. As for examples of the electron-attractive group, they include F and Cl. When the surface of the nano-crystal diamond film is formulated to have such a surface chemisorption structure, it is possible to obtain a nano-crystal diamond film having a surface exhibiting a low friction property and a high work function.

As for the method of obtaining a nano-crystal diamond film whose surface is terminated with F or Cl, it is possible to employ a method wherein a nano-crystal diamond film is formed by means of plasma CVD method and then the surface thereof is subjected to a plasma treatment using a fluorinated gas or a chlorinated gas. As for the fluorinated gas, it is possible to employ $CF_4$ or $SF_6$. As for the chlorinated gas, it is possible to employ $Cl_2$ or $CCl_4$.

In the case of the nano-crystal diamond film according to this embodiment of the present invention, which is constructed as described above, it is possible to control the properties of the film by controlling the crystal grain diameter or by adding an impurity. The control of the crystal grain diameter can be executed by controlling the temperature of substrate on the occasion of forming the film. The control of the properties of film through the addition of an impurity can be executed by controlling the kind and dosage of impurity.

Since the nano-crystal diamond film according to this embodiment is high in crystallinity, the film is provided with various physical properties which are equivalent to those of normal diamond. Further, since the surface of nano-crystal diamond film is excellent in flatness, the fine working as well as the formation of a laminated device can be easily applied thereto. Therefore, the surface of a nano-crystal diamond film is excellent in physical features enabling it to be used for various kinds of applications including enhance hardness, enhanced Young's modulus, enhanced heat resistance, enhanced heat conductivity, wide band gap, enhanced resitivity, etc.

Next, the method of manufacturing the nano-crystal diamond film according to this embodiment explained above will be explained.

The nano-crystal diamond film according to this embodiment can be formed by means of the CVD method using a raw gas comprising hydrocarbon and hydrogen. In this case, hydrogen is considered as serving not only as a dilution gas for the hydrocarbon but also as a factor for promoting the crystallization. Though it may depend on the kind of hydrocarbon, the ratio between the hydrocarbon and hydrogen may generally be within the range of 1:99 to 50:50, more preferably 5:95 to 20:80. If the ratio of hydrogen in the raw gas is too small, the film to be obtained would become amorphous carbon. On the other hand, if the ratio of hydrogen in the raw gas is too large, the nano-crystal diamond film to be obtained may contain a large quantity of crystal grain having a diameter of 1000 nm or more.

Incidentally, as for the hydrocarbon, it is possible to employ methane, ethane, propane, ethylene, acetylene, etc. Among them, methane is most preferable.

Further, the raw gas containing the hydrocarbon and hydrogen may be further added with at least one kind of gas selected from the group consisting of hydrogen sulfide or sulfur oxide, diborane, oxygen, carbon dioxide, phosphine, ammonia or nitrogen, and silane. It is possible, through control of the mixing ratio of these additive gases, to obtain various kinds of nano-crystal diamond films differing in structure such as crystallinity, and in physical properties such as conductivity, thus facilitating the control of the physical properties of the film.

The nano-crystal diamond film of the present invention should preferably be formed with the temperature of the substrate being selected from the range of 20° C. to 900° C., more preferably the range of 300° C. to 600° C. The diameter of the crystal grains of the film can be controlled by suitably selecting the temperature of the substrate.

Further, the nano-crystal diamond film of the present invention can be formed by means of a microwave plasma CVD method using a high-density plasma source, or an ECR plasma method. When these methods are employed, a hydrocarbon employed as a raw material can be effectively decomposed, thus making it possible to enhance the quality of the film and the throughput.

Further, when the nano-crystal diamond film of the present invention is to be formed by means of the plasma CVD method, it is necessary to make sure that the formation of the nano-crystal diamond film takes place outside the plasma region. When the formation of the nano-crystal diamond film takes place outside the plasma region, the temperature of substrate can be maintained at lower temperatures and the radicals can be effectively utilized, thus making it possible to obtain a nano-crystal diamond film wherein the crystal grain diameter is confined within the range of 1 nm to 1000 nm.

The formation of a nano-crystal diamond film should preferably be carried out with a substrate being disposed on a downstream side of the reaction gas flow in a CVD chamber. When a substrate is disposed on a downstream side of the reaction gas flow, the injection of ions into the surface of substrate can be facilitated, thus making it possible to form a film of high quality.

In the formation of the nano-crystal diamond film with the temperature of substrate being set to the range of 500° C. to 900° C., it is possible to employ a silicon substrate, a quartz substrate, a metal substrate or a ceramic substrate. On the other hand, when the temperature of substrate is set to the range of 300° C. to 500° C., it is possible to employ a glass substrate. Further, when the temperature of substrate is set to the range of 100° C. to 300° C., it is possible to employ a polymer substrate.

In a case where a silicon substrate is employed as a base body, it is possible to obtain a nano-crystal diamond film which can be applied to a charged corpuscular-rays mask, a hard mask for lithography, a micromachine, etc.

Further, in a case where a glass substrate or a polymer substrate is employed as a base body, it is possible to obtain a nano-crystal diamond film which can be applied to a cold cathode electron source, an electrode film for a thin display device such as an electroluminescent device and a liquid crystal display or an electrode film for a solar cell, etc.

Furthermore, in a case where a metal (it is not limited to a substrate but may be a stereoscopic configuration) is employed as a base body, it is possible to obtain a nano-crystal diamond film which can be applied to an electrochemical electrode or a covering material for tools and magnetic heads.

Next, various examples of application of the nano-crystal diamond film according to one embodiment of the present invention which is explained above will be explained.

The nano-crystal diamond film according to one embodiment of the present invention can be applied to an electrochemical device, an electrochemical electrode, a DNA chip, an organic electroluminescent device, an organic photoelectric receiving device, an organic thin film transistor, a cold electron-releasing device, a fuel cell, and a catalyst.

Next, application examples of these devices will be explained one after another.

1. Electrochemical Device

The nano-crystal diamond film according to one embodiment of the present invention can be employed for measuring the composition and concentration of a solution. Namely, this diamond film can be applied to an electrochemical device comprising one or more pairs of electrodes (including a detection electrode) to detect the identification and concentration of a substance to be measured by taking advantage of redox reaction of the surface of electrodes.

Namely, when the nano-crystal diamond film according to one embodiment of the present invention is applied to the surface of at least one of the electrodes, it is possible to provide an electrochemical device comprising one or more pairs of electrodes and designed to detect and measure the kind and concentration of a substance to be measured by taking advantage of a redox reaction of the surface of the electrodes.

Since the electrochemical device according to this embodiment employs a diamond film as an electrode, the chemical and physical stabilities thereof would become incomparably strong due to the strong diamond bond, thus exhibiting very high reliability as compared with other kinds of electrode materials. Further, since this electrochemical device is now provided with a wide potential window and a small background current, i.e. electrochemical properties peculiar to diamond, it is possible to measure a wide range of substances and to secure a high S/N ratio, thus making it possible to enhance the sensitivity thereof.

In the electrochemical device according to this embodiment, the diamond film should preferably be formed of a nano-crystal diamond film having a crystal grain diameter ranging from 1 nm to less than 1000 nm.

Further, in the electrochemical device according to this embodiment, the surface flatness (root-mean square surface roughness) of the nano-crystal diamond film should preferably be confined to not more than 10 nm.

Further, in the electrochemical device according to this embodiment, the aforementioned diamond film or the nano-crystal diamond film should preferably be formed as a pattern of optional configuration on the same substrate so as to constitute a plurality of very fine electrodes of micro- or nano-scale.

Especially, although the crystal grain size of the nano-crystal diamond film is of the order of nanometers, since each of these nano-grains is constituted by diamond crystal, the film is capable of exhibiting almost the same physical properties as those of monocrystalline or polycrystalline diamond. Namely, even though the crystal grains are of nano-size, they are capable of exhibiting various physical features which are peculiar to normal diamond. Further, the nano-crystal diamond film has a very flat surface structure. Because of this, semiconductor lithography techniques can be applied to the nano-crystal diamond film, thus making it possible to create a pattern on the nano-scale and hence to manufacture an ultra-fine electrode and to realize the enhancement of sensitivity.

In the electrochemical device according to this embodiment, the base body on which a nano-crystal diamond film can be formed may be formed of at least one kind of substrate selected from the group consisting of a silicon substrate, a quartz substrate, a ceramic substrate, a metal substrate, a glass substrate and a polymer substrate. Namely, the nano-crystal diamond film of the present invention can be formed, as a film having almost the same physical properties as those of diamond, on a practical substrate other than a diamond substrate. For example, as for the practical substrate to be employed in a high-temperature process at a temperature ranging from 500° C. to 900° C., it is possible to employ a silicon substrate, a quartz substrate, a metal substrate or a ceramic substrate. On the other hand, as for the practical substrate to be employed in a low-temperature process at a temperature ranging from 300° C. to 500° C., it is possible to employ a glass substrate. Further, as for the practical substrate to be employed in a process at a temperature ranging from 100° C. to 300° C., it is possible to employ a polymer substrate.

Particularly in a case where a glass substrate or a polymer substrate is employed, since these substrates are inexpensive and represent an insulating substrate, it is no longer necessary to employ the insertion of an insulating layer which is usually required in the case of a conductive substrate. Accordingly, it is now possible to easily achieve element isolation in the process of refining the semiconductor elements or refining the terminal portion of semiconductor elements.

Further, in the electrochemical device according to this embodiment, the diamond film or the nano-crystal diamond film can be doped with an impurity element, thus making it possible to control the semiconductor by suitably selecting the species and quantity of the dopant.

Further, in the electrochemical device according to this embodiment, the diamond film or the nano-crystal diamond film should preferably be doped with an impurity. As for the impurity, it is preferable to employ at least one kind of material selected from the group consisting of sulfur, boron, oxygen, phosphorus, nitrogen and silicon.

Depending on the kind of impurity to dope, the nano-crystal diamond film may exhibit n-type or p-type impurity conductivity, thus obtaining semiconductor characteristics and also high electric conductivity.

The electrochemical device according to this embodiment can be manufactured by a method comprising a step of forming at least a diamond film or a nano-crystal diamond film on the surface of base body.

In this method, it is preferable to employ, as a base body, a glass substrate or a polymer substrate and to confine the temperature of forming a diamond film or a nano-crystal diamond film to not higher than 500° C.

As described above, the nano-crystal diamond film, in particular, can be formed at a low temperature of not more than 500° C., under which condition the conventional diamond film has failed to be formed. Accordingly, it is now possible to form a nano-crystal diamond film on a glass substrate or a polymer substrate, both being low in melting point. Namely, since the nano-crystal diamond film can be formed on an inexpensive insulating substrate, it is now possible to easily perform the element isolation, to simplify the structure of device and to reduce the number of steps.

Further, the electrochemical device according to this embodiment can be manufactured by a method comprising a step of forming, at least, a diamond film or a nano-crystal diamond film on a base body, and a step of transforming the diamond film or the nano-crystal diamond film into a pattern by means of lithography.

As described above, since the nano-crystal diamond film in particular is designed to have a very flat surface structure, the technique of refining work for the semiconductor can be easily applied to the nano-crystal diamond film. Namely, the lithography technique using s laser, electron beam, etc. can be applied to the nano-crystal diamond film. As a result, it is possible to realize ultra-fine working of a semiconductor element or the terminal portions thereof, thus making it possible to enhance the sensitivity of the semiconductor element.

Since the surface of electrode of the electrochemical device according to this embodiment is constructed by making use of a diamond film which is excellent in physical and chemical stabilities, it is possible to provide an electrochemical device which is excellent in resistance in various respects and is improved in reliability and in life. Further, when the nano-crystal diamond film is applied to the surface of the electrochemical device, the surface of the electrochemical device is enabled to have a very flat surface structure constituted by crystal grains of the order of nanometers in diameter, the lithography technique for semiconductor can be applied thereto, thus making it possible to apply ultra-fine working of the order of submicrons thereto. As a result, it is now possible to realize the miniaturization of a semiconductor element as well as the refining of the terminal portion thereof, and hence to increase the surface area of the sensitive portion of the element, thus making it possible to enhance the sensitivity of the semiconductor element.

Further, since the nano-crystal diamond film as described above can be formed at a low temperature of not more than 500° C., it is now possible to utilize, as a base body, an inexpensive glass substrate or polymer substrate, thus making it possible to reduce the manufacturing cost. At the same time, since it is possible to utilize the aforementioned insulating substrate on the occasion of refining the terminal portion, it is no longer required to employ a step of element isolation, resulting in the simplification of the element structure and in the decrease in number of steps, thus realizing a reduction in the manufacturing cost.

FIG. 2A is a perspective view illustrating a main portion of the electrode terminal of the electrochemical device according to one embodiment of the present invention.

As for a base body 11, it is possible to employ a silicon substrate, a quartz substrate, a ceramic substrate, a metal substrate, a glass substrate or a polymer substrate.

The base body shown in FIG. 2A is formed of a planar substrate. However, the base body may be formed of a stereoscopic substrate such as a cylindrical substrate, a spherical substrate, etc.

The diamond film 12 formed on the substrate 11 is preferably formed of a nano-crystal diamond film comprising diamond crystal grains each having a grain diameter ranging from 1 nm to not more than 1000 nm. If the diameter of crystal grain of the nano-crystal diamond film is less than 1 nm, the grain boundary thereof would become too large due to the microcrystallinity thereof or amorphous component would become too large, thus failing to derive the properties peculiar to normal diamond. Further, if the diameter of crystal grains of the nano-crystal diamond film is 1000 nm or more, the roughness of the surface of the film would become prominent, thus making the film unsuited for a working process such as patterning or for constructing a laminate structure with other kinds of materials, and therefore, such a film cannot be used for practical applications. A preferable range of the diameter of the crystal grain would be 1 nm to 100 nm.

Incidentally, it should not be construed that the nano-crystal diamond film of the present invention is strictly limited to those which do not include at all a crystal grains having a diameter of less than 1 nm or having a diameter of 1000 nm or more. Namely, even if a very small amount of crystal grain having a diameter of less than 1 nm or a very small amount of crystal grains having a diameter of 1000 nm or more is included in the nano-crystal diamond film, it is possible to substantially secure the effects of the present invention. In other words, what is required in the present invention is that not less than 80% of crystal grains in the nano-crystal diamond film should be constituted by crystal grains having a grain diameter ranging from 1 nm to not more than 1000 nm.

Further, the nano-crystal diamond film of the present invention may be doped with at least one kind of impurity selected especially from sulfur, boron, oxygen, nitrogen and silicon. When the nano-crystal diamond film is doped with these impurity, e.g. sulfur and nitrogen both functioning as a donor, or boron functioning as an acceptor, it is possible to enhance the conductivity of the film itself due to the conductivity of these impurity and also to derive semiconductor properties.

As for the thickness of the nano-crystal diamond film, there is not any particular limitation and hence it can be suitably selected depending on the application thereof.

Since the nano-crystal diamond film is high in crystallinity, it is provided with various physical properties which are equivalent to those of normal diamond. Further, since the surface of electrochemical device is enabled to have a very flat, the lithography technique for a semiconductor can be applied thereto, thus making it possible to easily obtain an ultra-fine structure of the order of submicrons.

When the aforementioned fine working is employed, it is possible to transform the diamond film 12' into a pattern (for example, a tandem electrode) to thereby increase the area of the electrode of the element, thus realizing an enhancement in sensitivity of the element (FIG. 2B).

Next, a method of manufacturing the electrochemical device according to this embodiment will be explained with reference to drawings.

FIGS. 3A-3E are cross-sectional views each illustrating the manufacturing process of a main portion of electrode terminal of an electrochemical device according to one embodiment of the present invention.

First of all, by means of a CVD method using a raw gas comprising hydrocarbon and hydrogen, a nano-crystal diamond film 22 is formed (FIG. 3A).

Figure 3B:
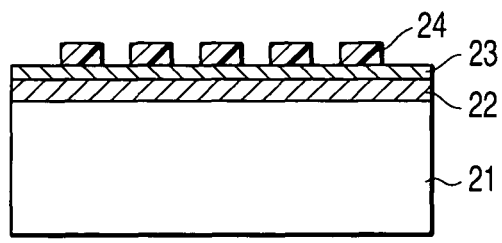

Then, after finishing the formation of a hard mask layer 23, a resist film is coated on the nano-crystal diamond film 22 and worked into a pattern by means of photolithography or electron-rays lithography to form a resist pattern 24 (FIG. 3B).

Figure 3C:
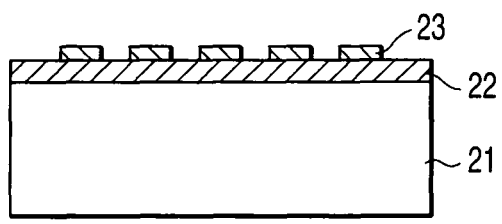

Then, by means of RIE, the resist pattern 24 is transcribed onto the hard mask layer 23 to form a hard mask pattern 23' (FIG. 3C).

Figure 3D:
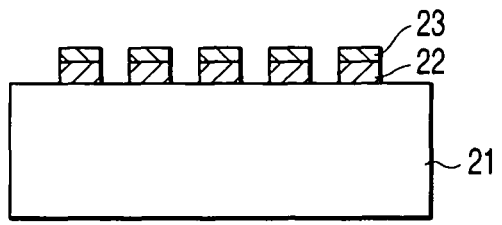

By making use of the hard mask pattern 23' as an etching mask, the nano-crystal diamond film 22 is worked by means of RIE using oxygen gas as a main component to obtain a pattern 22' of the detection portion of electrochemical device (FIG. 3D).

Figure 3E:
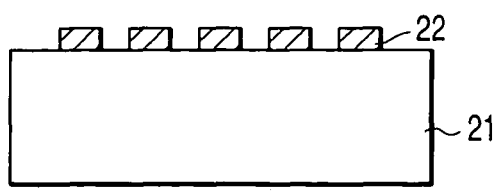

Finally, the hard mask pattern 23' is peeled away to accomplish an electrochemical device (FIG. 3E).

2. Electrochemical Electrode

The nano-crystal diamond film according to one embodiment of the present invention can be employed for purifying or unhazardizing a liquid or gas containing impurity, environmental contaminants by making use of an electrochemical reaction. Specifically, the nano-crystal diamond film can be applied to an electrochemical electrode which is designed to decompose a substance which can be hardly decomposed by means of electrolysis.

In recent years, diamond is noticed as being useful as an electrode material. Since the crystal of diamond is constituted by a strong covalent bond of carbon atoms of a 4-coordinated sp3 hybrid orbital, diamond exhibits incomparable physical and chemical stabilities. Especially, the chemical stability, i.e. chemical resistance and erosion resistance are indispensable in obtaining a high-performance and high-reliability electrode material.

If diamond is to be used as such an electrode material, it is required to provide diamond with conductivity. Diamond is an excellent insulating body having a band gap of 5.5 eV. However, as in the case of silicon, it is possible to provide diamond with conductivity through impurity conduction which can be effected by the doping of an impurity. One example of such a conductive diamond which is most generally known nowadays is boron-doped diamond which can be manufactured so as to have a specific resistance of not more than several $\Omega$cm.

The electrode constituted by the nano-crystal diamond film according to one embodiment of the present invention has the following features.

a) When the nano-crystal diamond film is applied to an electrode, the surface area of the electrode can be increased. Further, since the nano-crystal diamond film can be formed at low temperatures of not higher than 500° C., it can be formed on a substrate which can be easily worked into a specific configuration or can be easily deformed such as a glass substrate or a polymer substrate. Further, the nano-crystal diamond film can be formed by means of a CVD method, the nano-crystal diamond can be uniformly coated on an irregular surface such as a projected/recessed surface or a curved surface. Further, since the surface of the nano-crystal diamond film is flat and smooth, lithography can be applied thereto, thus making it possible to perform the fine working of electrodes and to increase the reaction area thereof.

b) Since the nano-crystal diamond film can be uniformly deposited on a substrate irrespective of the degree to which the surface of substrate is roughened, the surface of a silicon substrate can be formed to have a projected/recessed configuration (pyramid-like configuration), thus making it possible to increase the surface area thereof.

Figure 4A:
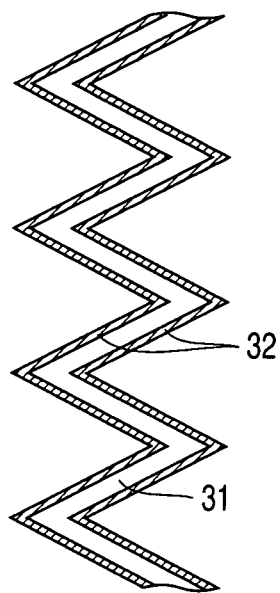
FIGS. 4A-4C are cross-sectional views each illustrating an electrochemical electrode whose surface is coated with a nano-crystal diamond film.
Figure 4B:
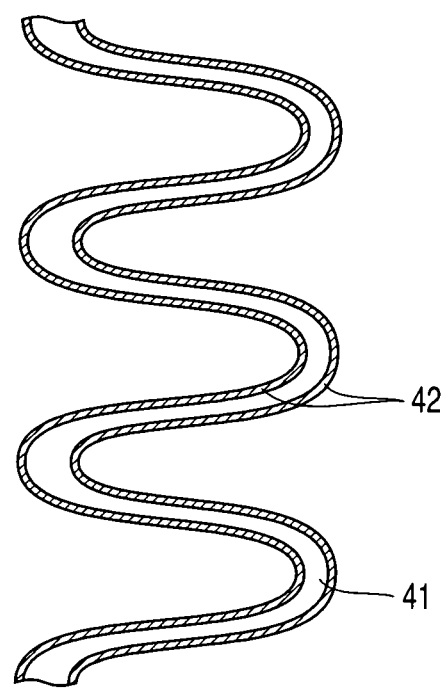
Figure 4C:
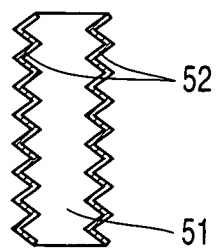

FIGS. 4A to 4C show respectively a cross-section of an electrochemical electrode having a nano-crystal diamond film adhered to the surface thereof, each representing a configuration increased in surface area. Namely, FIG. 4A shows an electrode wherein nano-crystal diamond film 32 is formed on the opposite surfaces of a substrate 31 having a zigzag configuration. FIG. 4B shows an electrode wherein a nano-crystal diamond film 42 was formed on the opposite surfaces of a substrate 41 having a corrugate configuration. FIG. 4C shows an electrode wherein a nano-crystal diamond film 52 was formed on the opposite surfaces of a substrate 51 having a serrated configuration.

A pair of these electrochemical electrodes are designed to be disposed to face each other. Incidentally, in the examples shown in FIGS. 4A to 4C, the nano-crystal diamond film is deposited on the opposite surfaces of the substrate. However, the nano-crystal diamond film may be deposited on only one surface of the electrode.

3. DNA Chip

The nano-crystal diamond film according to one embodiment of the present invention can be applied to a DNA chip.

The conventional DNA chip is accompanied with problems that since the surface of diamond film is considerably roughened, the surface thereof is required to be polished, resulting in an increase of manufacturing cost and in the generation of crystal defects on the surface thereof, thus badly affecting the property thereof as a carrier. Further, since the substrate useful in this case is limited to heat-resistant silicon, the manufacturing cost of the chip is caused to increase and it is difficult to increase the surface area of the chip.

Additionally, since the diamond component in the conventional DLC-based DNA chip is less than 30% at most, it is impossible to secure sufficient stability and to prevent contaminants other than carbon from easily adhering onto the surface of the chip, thus failing to secure satisfactory properties as a carrier.

Whereas, in the case of the DNA chip according to this application example, since a nano-crystal diamond film which can be formed at low temperatures is employed, it can be formed even on a glass substrate or a polymer substrate, thus making it possible to reduce the manufacturing cost thereof. Further, this nano-crystal diamond film is advantageous in that it is not required to be polished as the surface thereof is inherently smooth and flat, that the DNA can be prevented from being desorbed during hydrolysis, and that the DNA-retaining property thereof is excellent.

Figure 5:
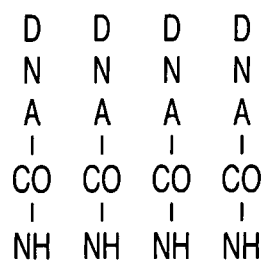
FIG. 5 is a cross-sectional view showing a DNA chip according to one application example of the present invention.
Figure 5:
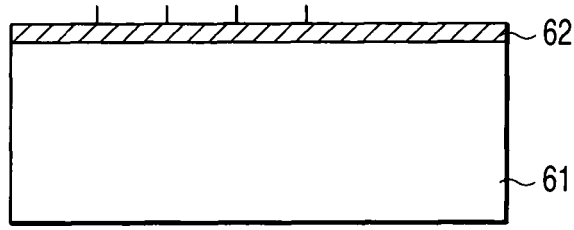

FIG. 5 shows a cross-sectional view of the DNA chip according to this embodiment. In FIG. 5, a nano-crystal diamond film 62 is deposited on the surface of a substrate 61, the surface of the nano-crystal diamond film 62 is laminated and carboxylated, and the DNA is immobilized through the presence of amino group and carboxyl group.

4. Organic Electroluminescent Device

The nano-crystal diamond film according to one embodiment of the present invention can be applied to an organic electroluminescent device.

Namely, a nano-crystal diamond film can be used as the anode or the cathode of the organic electroluminescent device or as a surface layer of anode or a surface layer of a cathode of the organic electroluminescent device, and, at the same time, the surface of these electrodes is terminated with an electron-attractive group or an electron-donating group. By doing so, it is possible to realize both a low work function and high work function ranging from 2.8 eV to 6.5 eV, thus making it possible to realize an organic electroluminescent device exhibiting a high luminescence efficiency.

In this case, a nano-crystal diamond film is formed by means of a plasma CVD method using a raw gas comprising hydrocarbon and hydrogen. The surface of the nano-crystal diamond film thus formed is subjected to a plasma treatment using a gas containing an electron-attractive atom or a gas containing an electron-donating atom, thus making it possible to control the work function by making use of the same material, thereby obtaining a high work function and a low work function. By making use of a thin film electrode comprising this nano-crystal diamond film, it is now possible to obtain an organic electroluminescent device exhibiting a high luminescence efficiency.

According to all of the methods described above, a low temperature plasma is utilized, so that they are suited for a device of large area such as a display device. Therefore, these methods can be said as being effective in practical use for forming a film of large size at low temperatures.

Figure 6:
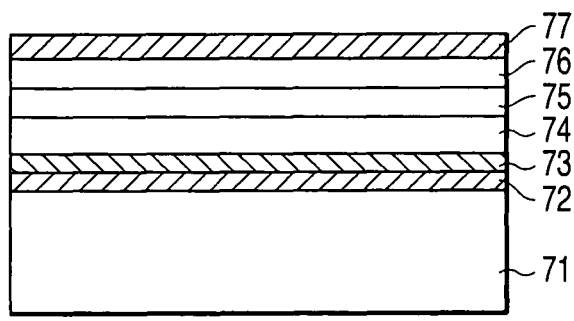
FIG. 6 is a cross-sectional view showing an organic electroluminescent device according to one application example of the present invention.

FIG. 6 shows a cross-sectional view of an organic electroluminescent device according to this application example. Referring to FIG. 6, an anode 72, an anode surface layer 73, a hole transport layer 74, an organic luminescent layer 75, an electron transport layer 76 and a cathode 77 are successively deposited on the surface of a substrate 71, thereby constructing the organic electroluminescent device. In this example, the anode surface layer 73 is formed by making use of a nano-crystal diamond film. Namely, a nano-crystal diamond film is deposited on the surface of the anode 72 consisting for example of ITO by means of a plasma CVD method using a raw gas comprising hydrocarbon and hydrogen. Then, the surface of the nano-crystal diamond film formed in this manner is subjected to a plasma treatment using a gas containing electron-attractive atoms to obtain a high surface work function.

5. Organic Solar Cell

The nano-crystal diamond film according to one embodiment of the present invention can be applied to an organic solar cell.

Namely, a nano-crystal diamond film can be used as the anode or the cathode of the organic solar cell or as a surface layer of anode or a surface layer of cathode of the organic solar cell, and, at the same time, the surface of these electrodes is terminated with an electron-attractive group or an electron-donating group. By doing so, it is possible to realize both low work function and high work function ranging from 2.8 eV to 6.5 eV, thus making it possible to realize an organic solar cell exhibiting a high luminescence efficiency.

In this case, a nano-crystal diamond film is formed by means of a plasma CVD method using a raw gas comprising a hydrocarbon and hydrogen. The surface of the nano-crystal diamond film thus formed is subjected to a plasma treatment using a gas containing electron-attractive atoms or a gas containing electron-donating atoms, thus making it possible to control the work function by making use of the same material, thereby obtaining a high work function and a low work function. By making use of a thin film electrode comprising this nano-crystal diamond film, it is now possible to obtain an organic solar cell exhibiting a high luminescence efficiency.

According to the method described above, a low temperature plasma is utilized, so that it can be employed for forming a film of large size at low temperatures. Therefore, this method can be said as being effective in practical use for the manufacture of a device of large area such as a solar cell.

Figure 7:
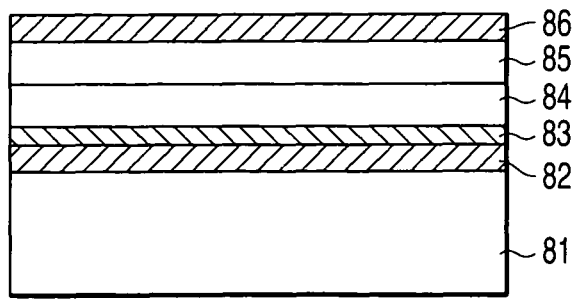
FIG. 7 is a cross-sectional view showing an organic solar cell according to one application example of the present invention.

FIG. 7 shows a cross-sectional view of an organic solar cell according to this application example. Referring to FIG. 7, an anode 82, an anode surface layer 83, a p-type organic semiconductor layer 84, an n-type organic semiconductor layer 85 and a cathode 86 are successively deposited on the surface of a substrate 81, thereby constructing the organic solar cell. In this example, the anode surface layer 83 is formed by making use of a nano-crystal diamond film. Namely, a nano-crystal diamond film is deposited on the surface of the anode 82 consisting for example of ITO by means of a plasma CVD method using a raw gas comprising a hydrocarbon and hydrogen. Then, the surface of the nano-crystal diamond film formed in this manner is subjected to a plasma treatment using a gas containing an electron-attractive atom to obtain a high surface work function.

6. Organic Thin Film Transistor

The nano-crystal diamond film according to one embodiment of the present invention can be applied to an organic thin film transistor.

Namely, a nano-crystal diamond film can be used as the anode or the cathode of the organic thin film transistor or as a surface layer of anode or a surface layer of cathode of the organic thin film transistor, and, at the same time, the surface of these electrodes is terminated with an electron-attractive group or an electron-donating group. By doing so, it is possible to realize both low work function and high work function ranging from 2.8 eV to 6.5 eV, thus making it possible to realize an organic thin film transistor exhibiting a high luminescence efficiency.

In this case, a nano-crystal diamond film is formed by means of a plasma CVD method using a raw gas comprising a hydrocarbon and hydrogen. The surface of the nano-crystal diamond film thus formed is subjected to a plasma treatment using a gas containing electron-attractive atoms or a gas containing electron-donating atoms, thus making it possible to control the work function by making use of the same material, thereby obtaining a high work function and a low work function. By making use of a thin film electrode comprising this nano-crystal diamond film, it is now possible to obtain an organic thin film transistor exhibiting high switching characteristics.

According to the method described above, a low temperature plasma is utilized, so that it can be employed for forming a film of large size at low temperatures. Therefore, this method can be said as being effective in practical use for the manufacture of a device of large area such as a display device.

Figure 8:
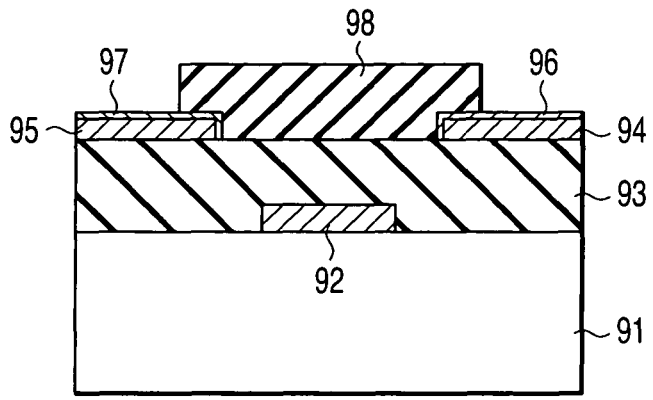
FIG. 8 is a cross-sectional view showing an organic thin film transistor according to one application example of the present invention.

FIG. 8 shows a cross-sectional view of an organic thin film transistor according to this application example. Referring to FIG. 8, a gate electrode 92 and a gate insulating film 93 are formed on an insulating substrate 91. On this gate insulating film 93 are formed a source electrode 94 and a drain electrode 95 so as to face each other. On the surfaces of these source electrode 94 and drain electrode 95, there are deposited a source electrode surface layer 96 and a drain electrode surface layer 97, respectively. On these source electrode surface layer 96, drain electrode surface layer 97 and gate insulating film 93, there is deposited a p-type organic semiconductor layer 98, thereby constructing the organic thin film transistor.

In this example, the source electrode surface layer 96 and the drain electrode surface layer 97 are formed by making use of a nano-crystal diamond film. Namely, a nano-crystal diamond film is deposited on the surfaces of the source electrode 94 and the drain electrode 95 by means of a plasma CVD method using a raw gas comprising hydrocarbon and hydrogen. Then, the surface of the nano-crystal diamond film formed in this manner is subjected to a plasma treatment using a gas containing an electron-attractive atom to obtain a high surface work function.

7. Cold Electron-Releasing Device

The nano-crystal diamond film according to one embodiment of the present invention can be applied to a cold electron-releasing device.

The cold electron-releasing device (FED) is now noticed as useful in particular as an electron source of a high-performance flat panel display device of the next generation. This FED can be employed substituting for the thermoelectronic emission device of conventional CRT. Specifically, by making use of the fine working technique for semiconductor, a minute field emission type electron-releasing device (cold electron-releasing device) is attached to every pixel to thereby make it possible to reduce the thickness of display device while taking advantage of the same principle of cathode luminescence as that of CRT which is excellent in high luminescence and in high display speed.

This cold electron-releasing device is designed such that, by way of field emission, electrons are enabled to be released from a solid surface to a vacuum chamber, wherein the characteristics thereof can be determined depending on the structure of the surface of electron-releasing material and on the work function (electronic affinity).

On the other hand, the hydrogen-terminated surface of diamond is provided with negative electronic affinity. Namely, once this hydrogen-terminated surface of diamond is left to stand in vacuum, a large quantity of electrons are enabled to be released without necessitating the application of electric field, which is unique characteristics other kinds of materials fail to have.

Therefore, although diamond (hydrogen-terminated surface thereof) is useful as an electron-releasing element material in principle, it has been considered impossible to date to apply it on an inexpensive glass substrate of large area, which is typically employed as a substrate for a display device because of the reason that it requires high temperatures (800° C.). Further, since the conventional diamond is large in crystal grain, it is difficult to uniformly deposit it as a thin film on a surface of refined structure.

In the case of the nano-crystal diamond film of the present invention however, since it can be uniformly deposits as a thin film on a surface of a refined structure, it is now possible to apply diamond, which is an ideal material, to a cold electron-releasing device.

Specifically, when the nano-crystal diamond film is employed as a surface layer of an emitter of a cold electron-releasing device and the resultant surface is treated so as to be terminated with an electron-donating group, it is possible to realize the creation of a negative electronic affinity (low work function: 2.8 eV), thus obtaining a cold electron-releasing device of high efficiency and low voltage driving. In this case, the nano-crystal diamond film is formed by means of a plasma CVD method using a raw gas comprising a hydrocarbon and hydrogen, and then the surface of the nano-crystal diamond film is subjected to a plasma treatment using a gas containing electron-donating atoms, thereby making it possible to control the surface work function by making use of the same material and hence to realize a low work function (negative electronic affinity). Therefore, when this nano-crystal diamond film is used as an emitter surface layer, it is possible to obtain a cold electron-releasing device of high efficiency and low voltage driving.

According to the method described above, a low temperature plasma is utilized, so that it can be employed for forming a film of large size at low temperatures. Therefore, this method can be said as being effective in practical use for the manufacture of a device of large area such as a display device.

Figure 9:
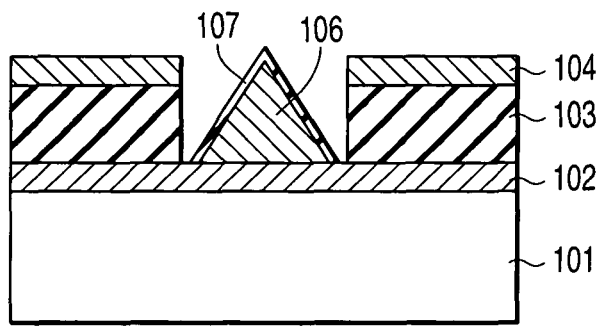
FIG. 9 is a cross-sectional view showing a cold electron-releasing device according to one application example of the present invention.

FIG. 9 shows a cross-sectional view of a cold electron-releasing device according to this application example. Referring to FIG. 9, in a manner that a hole can be created on an insulating substrate 101, an insulating layer 103 and a gate electrode 54 are selectively and successively formed on the insulating substrate 101 having an emitter wiring 102 formed thereon. A cone-shaped emitter 106 is formed on a portion of the emitter wiring 102 which is exposed through the hole. On this emitter 106, a nano-crystal diamond film 107 is deposited, thereby constructing the cold electron-releasing device. In this example, a nano-crystal diamond film is deposited on the surface of the emitter 106 made of a metal by means of a plasma CVD method. Then, the surface of this nano-crystal diamond film is subjected to a hydrogen plasma treatment to realize a high surface work function.

8. Electrode Catalyst for Fuel Cell

The nano-crystal diamond film according to one embodiment of the present invention can be applied to an electron catalyst for a fuel cell.

Since the nano-crystal diamond is very minute in size and the secondary structure thereof can be controlled, the nano-crystal diamond is advantageous in that even if it is formed of a very thin film, it is possible to secure high physical strength, that the surface area, which is one of the most important features of the electrode for a fuel cell can be greatly increased, and that gas and liquid are enabled to permeate into the interior of the electrode. In the case of an electrode made of activated carbon or carbon black which has been conventionally employed, these raw materials are required to be mixed with a polymer-based binder before the molding thereof in order to retain the structure of electrode. Therefore, even though a raw material having a large surface area as a primary particle is employed, a fairly large magnitude of the surface area is not effectively utilized in any way, thus necessitating a large amount of a noble metal such as Pt to be employed as a catalyst.

Further, in the case of activated carbon or carbon black, since they are mainly constituted by a graphite structure, the ratio of graphite plane (so-called Basel plane) is comparatively large for its large apparent surface area thereof. Therefore, the site which is available for the adsorption of catalytic metal in its highly dispersed state is not necessarily large. This situation is also considered as a cause for the requirement of a large quantity of catalyst.

Whereas, in the case of the nano-crystal diamond film, since all of the atoms existing on the surface thereof act to maintain the sp3 structure, the surface of the film is enabled to become an active surface, thus permitting a catalytic metal to adsorb thereon in a highly dispersed state.

Figure 10:
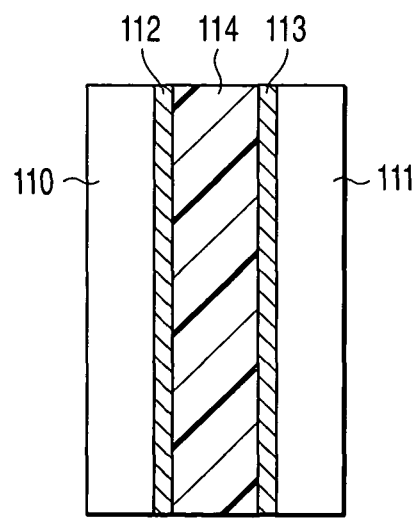
FIG. 10 is a cross-sectional view showing a fuel cell according to one application example of the present invention.

FIG. 10 is a cross-sectional view illustrating a single cell unit of a fuel cell according to the present invention. As shown in FIG. 10, nano-crystal diamond films 112 and 113, each carrying a catalyst, are deposited on the surfaces of cathode 110 and anode 111, respectively. Between these cathode 110 and anode 111, an electrolyte is integrally sandwiched so as to face the nano-crystal diamond films 112 and 113, thereby constituting a single cell unit of fuel cell.

9. Catalyst

The nano-crystal diamond film according to one embodiment of the present invention can be applied to catalysts of various types for effecting various kinds of reaction.

Namely, it is possible to obtain a metal-carrying nano-crystal diamond catalyst which is constituted by a carrier made of a nano-crystal diamond film, and by catalytic metal particles carried on the carrier and having a particle diameter of the order of nanometers.

In this catalyst according to this application example, since the particle diameter of the crystal grain constituting the nano-crystal diamond film to be employed as a carrier is of the order of as fine as nanometers, it is possible to carry a metallic catalyst of the order of nanometers, thus making it possible to achieve an enhancement of the catalytic reaction rate.

EXAMPLES

Next, specific examples of the present invention will be explained in detail with reference to the drawings.

Example 1

Figure 11A:
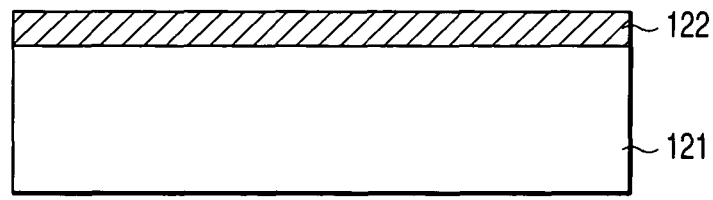
FIGS. 11A-11C are cross-sectional views each illustrating the manufacturing process of a nano-crystal diamond film according to a further aspect of the present invention.

As shown in FIG. 11A, by making use of a microwave plasma CVD apparatus, a nano-crystal diamond film 122 was formed on a monocrystalline silicon substrate 121 having a thickness of 525 μm.

The conditions for the microwave plasma CVD were as follows.

Raw gas: methane (flow rate: 2 sccm) and hydrogen (flow rate: 18 sccm)

Doping gas: hydrogen sulfide (0.01 to 5 vol % based on the raw gas)

Temperature of substrate: 500° C.

Reaction pressure: 5 Torr

MW power: 500 W

By means of the microwave plasma CVD and under the aforementioned conditions, a nano-crystal diamond film 122 having a thickness of 500 nm was formed. Upon finishing the formation of the film, the surface of the nano-crystal diamond film 122 was subjected to a hydrogen plasma treatment for 5 minutes.

When the nano-crystal diamond film 122 thus manufactured was observed by means of a transmission electron microscope (TEM), it was possible to confirm a crystal grain diameter of the order of nanometers. At the same time, by means of electron energy loss spectroscopy (EELS), the existence of sp3 (diamond bonding) was confirmed.

Further, when the identification of an adsorbed species on the surface of the film was performed by means of X-rays photoelectron spectroscopy (XPS), only carbon was detected and the non-existence of oxygen was confirmed. Further, it was possible to confirm, through the measurement of ultraviolet photoelectron spectroscopy (UPS), a negative electron affinity (NEA). When the electric conductivity of the surface of the film was measured, a sheet resistance of several kΩ was recognized.

Example 2

Figure 11B:
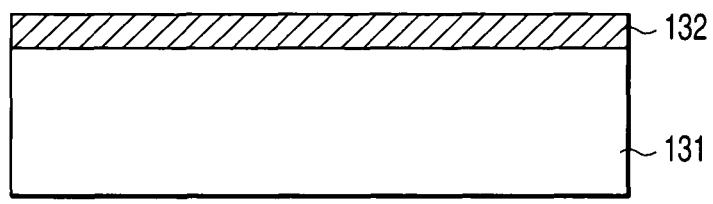

As shown in FIG. 11B, by making use of a microwave plasma CVD apparatus, a nano-crystal diamond film 132 was formed on a glass substrate 131 having a thickness of 1.1 mm.

The conditions for the microwave plasma CVD were as follows.

Raw gas: methane (flow rate: 2 sccm) and hydrogen (flow rate: 18 sccm)

Doping gas: hydrogen sulfide (0.01 to 5 vol % based on the raw gas)

Temperature of substrate: 300° C.

Reaction pressure: 5 Torr

MW power: 500 W

By means of the microwave plasma CVD and under the aforementioned conditions, a nano-crystal diamond film 132 having a thickness of 500 nm was formed. Upon finishing the formation of the film, the surface of the nano-crystal diamond film 132 was subjected to a hydrogen plasma treatment for 5 minutes.

As a result, it was possible to obtain a nano-crystal diamond film 132 having almost the same features as those obtained in Example 1 even in this example.

Example 3

Figure 11C:
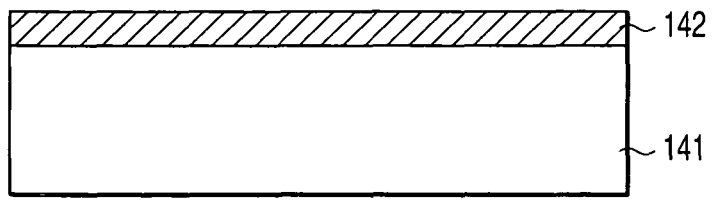

As shown in FIG. 11C, by making use of a microwave plasma CVD apparatus, a nano-crystal diamond film 142 was formed on a polymer substrate 141 having a thickness of 1 mm.

The conditions for the microwave plasma CVD were as follows.

Raw gas: methane (flow rate: 2 sccm) and hydrogen (flow rate: 18 sccm)
Doping gas: hydrogen sulfide (0.01 to 5 vol % based on the raw gas)
Temperature of substrate: 100° C.
Reaction pressure: 5 Torr
MW power: 200 W By means of the microwave plasma CVD and under the aforementioned conditions, a nano-crystal diamond film 142 having a thickness of 300 nm was formed. Upon finishing the formation of the film, the surface of the nano-crystal diamond film 142 was subjected to a hydrogen plasma treatment for 5 minutes.

As a result, it was possible to obtain a nano-crystal diamond film 142 having almost the same features as those obtained in Example 1 even in this example.

Next, examples related to various application examples of the nano-crystal diamond film according to the present invention will be explained.

Example 4

One example wherein the nano-crystal diamond film was applied to an electrochemical device will be explained with reference to FIGS. 3A to 3E.

As shown in FIG. 3A, by making use of a microwave plasma CVD apparatus, a nano-crystal diamond film 22 was formed on a glass substrate 21 having a thickness of 1 mm.

The conditions for the microwave plasma CVD were as follows.

Raw gas: methane (flow rate: 2 sccm) and hydrogen (flow rate: 18 sccm)
Doping gas: hydrogen sulfide (0.01 to 5 vol % based on the raw gas)
Temperature of substrate: 400° C.
Reaction pressure: 5 Torr
MW power: 500 W By means of the microwave plasma CVD and under the aforementioned conditions, a nano-crystal diamond film 22 having a thickness of 1 μm was formed. Upon finishing the formation of the film, the surface of the nano-crystal diamond film 22 was subjected to a hydrogen plasma treatment for 5 minutes.

Then, as shown in FIG. 3B, by making use of a mixed gas comprising silane, ammonia and hydrogen and by means of a high-frequency plasma CVD apparatus, a silicon nitride film was formed as a hard mask layer 23.

The conditions for the high-frequency plasma CVD were as follows.

Raw gas: silane (flow rate: 5 sccm), ammonia (flow rate: 20 sccm) and hydrogen (flow rate: 175 sccm)
Temperature of substrate: 200° C.;
Reaction pressure: 1 Torr
RF power: 180 W By means of the high-frequency plasma CVD and under the aforementioned conditions, a silicon nitride film having a thickness of 0.2 μm was formed.

Then, a photo-resist (OFPR; Tokyo Ohka Industries) was coated to a film thickness of 1.2 μm and then the photo-resist was exposed to g-rays and developed to obtain a photo-resist pattern 24 (line width: 5 μm).

Then, as shown in FIG. 3C, by making use of the photo-resist pattern 24 as a mask, a silicon nitride film to be employed as a hard mask layer 23 was worked by means of RIE using $C_2F_6$ and hydrogen gas to obtain a hard mask pattern 23'.

The conditions for the RIE were as follows.

Raw gas: $C_2F_6$ (flow rate: 32 sccm) and hydrogen (flow rate: 3 sccm)
Temperature of substrate: room temperature
Reaction pressure: 0.03 Torr
RF power: 300 W Then, as shown in FIG. 3D, by making use of the hard mask pattern 23' consisting of silicon nitride as a mask, a nano-crystal diamond film 22 was worked by means of RIE using oxygen gas as a major component to obtain terminal portions 22' of electrochemical device.

The conditions for the RIE were as follows.

Raw gas: $O_2$ (flow rate: 100 sccm)
Temperature of substrate: room temperature
Reaction pressure: 0.03 Torr
RF power: 300 W Finally, as shown in FIG. 3E, the terminal portions 22' were peeled away by means of etching to obtain an electrochemical device.

Example 5

One example wherein the nano-crystal diamond film was applied to an electrochemical electrode will be explained with reference to FIG. 4A.

As shown in FIG. 4A, by making use of a microwave plasma CVD apparatus, a nano-crystal diamond film 32 was formed on the opposite surfaces of a substrate 31 having a zigzag configuration which was created through the working of a glass substrate having a thickness of 1 mm.

The conditions for the microwave plasma CVD were as follows.

Raw gas: methane (flow rate: 2 sccm) and hydrogen (flow rate: 18 sccm)
Doping gas: hydrogen sulfide (0.01 to 5 vol % based on the raw gas)
Temperature of substrate: 300° C.
Reaction pressure: 5 Torr
MW power: 500 W By means of the microwave plasma CVD and under the aforementioned conditions, a nano-crystal diamond film 32 having a thickness of 5 μm was formed. Upon finishing the formation of the film, the surface of the nano-crystal diamond film 32 was subjected to a hydrogen plasma treatment for 5 minutes to obtain a sensor electrode having a configuration as shown in FIG. 4A.

Example 6

One example wherein the nano-crystal diamond film was applied to an electrochemical electrode will be explained with reference to FIG. 4B.

As shown in FIG. 4B, by making use of a microwave plasma CVD apparatus, a nano-crystal diamond film 42 was formed on the opposite surfaces of a substrate 41 having a corrugate configuration which was created through the working of a polymer substrate having a thickness of 100 μm.

The conditions for the microwave plasma CVD were as follows.

Raw gas: methane (flow rate: 2 sccm) and hydrogen (flow rate: 18 sccm)
Doping gas: hydrogen sulfide (0.01 to 5 vol % based on the raw gas)
Temperature of substrate: 200° C.
Reaction pressure: 5 Torr
MW power: 500 W By means of the microwave plasma CVD and under the aforementioned conditions, a nano-crystal diamond film 42 having a thickness of 3 μm was formed. Upon finishing the formation of the film, the surface of the nano-crystal diamond film 42 was subjected to a hydrogen plasma treatment for 5 minutes to obtain a sensor electrode having a configuration as shown in FIG. 4B.

Example 7

One example wherein the nano-crystal diamond film was applied to an electrochemical electrode will be explained with reference to FIG. 4C.

As shown in FIG. 4C, by making use of a microwave plasma CVD apparatus, a nano-crystal diamond film 52 was formed on the opposite surfaces of a substrate 51 having a serrated configuration which was created through the working of a silicon substrate having a thickness of 525 μm.

The conditions for the microwave plasma CVD were as follows.

Raw gas: methane (flow rate: 2 sccm) and hydrogen (flow rate: 18 sccm)
Doping gas: hydrogen sulfide (0.01 to 5 vol % based on the raw gas)
Temperature of substrate: 500° C.
Reaction pressure: 5 Torr
MW power: 500 W By means of the microwave plasma CVD and under the aforementioned conditions, a nano-crystal diamond film 52 having a thickness of 5 μm was formed. Upon finishing the formation of the film, the surface of the nano-crystal diamond film 52 was subjected to a hydrogen plasma treatment for 5 minutes to obtain a sensor electrode having a configuration as shown in FIG. 4C.

Example 8

One example wherein the nano-crystal diamond film was applied to a DNA chip will be explained with reference to FIG. 5.

By making use of a microwave plasma CVD apparatus, a nano-crystal diamond film 62 was formed on a glass substrate 61 having a thickness of 1 mm.

The conditions for the microwave plasma CVD were as follows.

Raw gas: methane (flow rate: 2 sccm) and hydrogen (flow rate: 18 sccm)
Doping gas: hydrogen sulfide (0.01 to 5 vol % based on the raw gas)
Temperature of substrate: 400° C.
Reaction pressure: 5 Torr
MW power: 500 W By means of the microwave plasma CVD and under the aforementioned conditions, a nano-crystal diamond film 62 having a thickness of 1 μm was formed. Upon finishing the formation of the film, the surface of the nano-crystal diamond film 62 was subjected to a hydrogen plasma treatment for 5 minutes.

Then, the nano-crystal diamond film 62 was irradiated with UV-rays in an atmosphere of chlorine gas to chlorinate the hydrogenated surface of the nano-crystal diamond film 62.

Thereafter, the nano-crystal diamond film 62 was irradiated with UV-rays in an atmosphere of ammonia gas to laminate the surface of the nano-crystal diamond film 62.

Finally, by making use of succinic acid, the surface of nano-crystal diamond film was carboxylated and then activated to immobilize DNA.

Example 9

One example wherein the nano-crystal diamond film was applied to an organic electroluminescent device will be explained with reference to FIG. 6.

As shown in FIG. 6, by means of a direct current reactive sputtering method using, as a target, an ITO containing 5 wt % of tin and by introducing a mixed gas consisting of 99% of argon (20 sccm) and 1% of oxygen (0.2 sccm) into a reaction chamber, an ITO film was formed, as an anode 72, at room temperature on a glass substrate having a thickness of 1 mm and employed as an insulating substrate 71. In this case, the film thickness of the ITO film was set to 200 nm.

Then, by making use of a microwave plasma CVD apparatus, a nano-crystal diamond film 73 was formed, as an anode surface layer 73, on an anode 72.

The conditions for the microwave plasma CVD were as follows.

Raw gas: methane (flow rate: 2 sccm) and hydrogen (flow rate: 18 sccm)
Doping gas: hydrogen sulfide (0.01 to 5 vol % based on the raw gas)
Temperature of substrate: 300° C.
Reaction pressure: 5 Torr
MW power: 500 W By means of the microwave plasma CVD and under the aforementioned conditions, a nano-crystal diamond film 73 having a thickness of 50 nm was formed.

Then, the nano-crystal diamond film 73 was subjected to a high-frequency plasma treatment by making use of an RIE apparatus provided with plane-parallel plate electrodes and employing $CF_4$ gas. The conditions for the plasma treatment in this case were set to 35 sccm in flow rate of $CF_4$ gas, 0.03 Torr in reaction pressure, 300 W in high-frequency power and 3 minutes in treatment time.

As a result, it was possible to create a fluorine-terminated surface structure on the surface of the nano-crystal diamond film 73 acting as an anode surface layer. This fluorine-terminated surface structure was analyzed by means of X-rays photoelectron spectroscopy to confirm a C—F structure. Further, when the surface potential of the fluorine-terminated surface was measured and reduced by making use of a Kelvin probe microscope (KFM), it was found possible to obtain a high surface work function of as high as 6.5 eV.

Subsequently, a hole transport layer 74, an organic luminescent layer 75 and an electron transport layer 76 were continuously vacuum-deposited on the surface of nano-crystal diamond film 73. Then, finally, an Al thin film having a thickness of 200 nm was deposited, as a cathode 77, on the resultant surface by means of the electron beam deposition method, thus accomplishing the manufacture of an organic electroluminescent device as shown in FIG. 6.

Example 10

One example wherein the nano-crystal diamond film was applied to an organic solar cell constituted by an organic photoelectric receiving device will be explained with reference to FIG. 7.

As shown in FIG. 7, by means of a direct current reactive sputtering method using, as a target, an ITO containing 5 wt % of tin and by introducing a mixed gas consisting of 99% of argon (20 sccm) and 1% of oxygen (0.2 sccm) into a reaction chamber, an ITO film was formed, as an anode 82, on a glass substrate having a thickness of 1 mm and employed as an insulating substrate 81. In this case, the film thickness of the ITO film was set to 200 nm.

Then, by making use of a microwave plasma CVD apparatus, a nano-crystal diamond film 83 was formed, as an anode surface layer 83, on an anode 82.

The conditions for the microwave plasma CVD were as follows.

Raw gas: methane (flow rate: 2 sccm) and hydrogen (flow rate: 18 sccm)
Doping gas: hydrogen sulfide (0.01 to 5 vol % based on the raw gas)
Temperature of substrate: 300° C.
Reaction pressure: 5 Torr
MW power: 500 W By means of the microwave plasma CVD and under the aforementioned conditions, a nano-crystal diamond film 83 having a thickness of 50 nm was formed.

Then, the nano-crystal diamond film 83 was subjected to a high-frequency plasma treatment by making use of an RIE apparatus provided with plane-parallel plate electrodes and employing $CF_4$ gas. The conditions for the plasma treatment in this case were set to 35 sccm in flow rate of $CF_4$ gas, 0.03 Torr in reaction pressure, 300 W in high-frequency power and 3 minutes in treatment time.

As a result, it was possible to create a fluorine-terminated surface structure on the surface of the nano-crystal diamond film 83 acting as an anode surface layer. This fluorine-terminated surface structure was analyzed by means of X-rays photoelectron spectroscopy to confirm a C—F structure. Further, when the surface potential of the fluorine-terminated surface was measured and reduced by making use of a Kelvin probe microscope (KFM), it was found possible to obtain a high surface work function of as high as 6.5 eV.

Subsequently, a p-type organic semiconductor layer 84 and an n-type organic semiconductor layer 85 were continuously vacuum-deposited on the surface of nano-crystal diamond film 83. Then, finally, an Al thin film having a thickness of 200 nm was deposited, as a cathode 87, on the resultant surface by means of electron beam deposition method, thus accomplishing the manufacture of an organic solar cell as shown in FIG. 7.

Example 11

One example wherein the nano-crystal diamond film was applied to an organic thin film transistor will be explained with reference to FIG. 8.

As shown in FIG. 8, by means of a sputtering method, a Ta thin film having a thickness of 200 nm was formed, as a gate electrode 92, on a glass substrate having a thickness of 1 mm and employed as an insulating substrate 91.

Then, by means of photolithography, the Ta thin film was formed into a pattern. Then, by means of rf plasma CVD method using silane and dinitrogen monoxide as a raw gas, an $SiO_2$ film 93 was formed on the resultant surface under the conditions of: 300° C. in substrate temperature, 1 Torr in reaction pressure and 180 W in rf power. The film thickness of the $SiO_2$ film 93 was set to 1 μm.

Subsequently, an Al thin film to be employed as a source electrode 94 and a drain electrode 95 was deposited to a thickness of 200 nm by means of an electron beam deposition method and then the Al thin film was formed into a pattern by means of photolithography.

Then, by making use of a microwave plasma CVD apparatus, nano-crystal diamond films 96 and 97 were formed to use them as a source electrode surface layer 96 and a drain electrode surface layer 97, respectively.

The conditions for the microwave plasma CVD were as follows.

Raw gas: methane (flow rate: 2 sccm) and hydrogen (flow rate: 18 sccm)
Doping gas: hydrogen sulfide (0.01 to 5 vol % based on the raw gas)
Temperature of substrate: 300° C.
Reaction pressure: 5 Torr
MW power: 500 W By means of the microwave plasma CVD and under the aforementioned conditions, the nano-crystal diamond films 96 and 97 both having a thickness of 50 nm were formed.

Then, these nano-crystal diamond films were subjected to a high-frequency plasma treatment by making use of an RIE apparatus provided with plane-parallel plate electrodes and employing $CF_4$ gas. The conditions for the plasma treatment in this case were set to 35 sccm in flow rate of $CF_4$ gas, 0.03 Torr in reaction pressure, 300 W in high-frequency power and 3 minutes in treatment time.

As a result, it was possible to create a fluorine-terminated surface structure on the surfaces of the nano-crystal diamond films 96 and 97 acting as a source electrode surface layer and a drain electrode surface layer, respectively. This fluorine-terminated surface structure was analyzed by means of X-rays photoelectron spectroscopy to confirm a C—F structure. Further, when the surface potential of the fluorine-terminated surface was measured and reduced by making use of a Kelvin probe microscope (KFM), it was found possible to obtain a high surface work function of as high as 6.5 eV.

Subsequently, a redundant portion of the nano-crystal diamond films 96 and 97 was removed. Then, a p-type organic semiconductor layer 98 having a prescribed configuration was formed by means of printing, thus accomplishing the manufacture of an organic thin film transistor as shown in FIG. 8.

Example 12

One example wherein the nano-crystal diamond film was applied to a cold electron-releasing device will be explained with reference to FIGS. 12A to 12E.

Figure 12A:
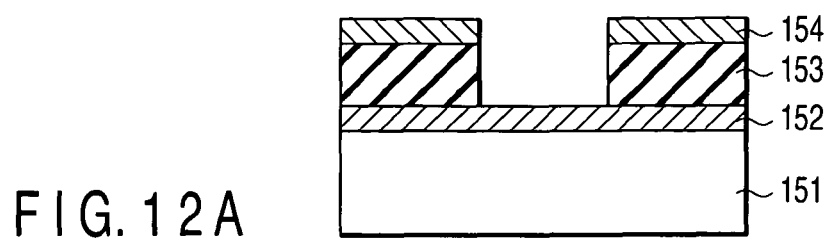
FIGS. 12A-12E are cross-sectional views each illustrating the manufacturing process of a cold electron-releasing device according to one application example of the present invention.

First of all, as shown in FIG. 12A, by means of sputtering method or vacuum deposition method, an insulating layer 153 and a gate electrode 154 were successively formed on a glass substrate 151 having an emitter wiring 152 formed in advance. Then, by making use of a photolithography and reactive ion etching method (RIE), part of the insulating layer 153 and the gate electrode 154 was etched away until the surface of the emitter wiring 152 was exposed to form a circular opening (gate hole).

Figure 12B:
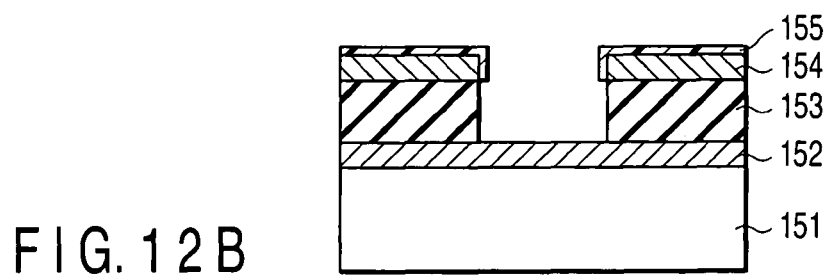

Then, as shown in FIG. 12B, by means of oblique deposition, a lift-off material 155 was selectively formed only over the gate electrode 154. As for the material for the lift-off material 155, it is possible to employ Al, MgO, etc.

Figure 12C:
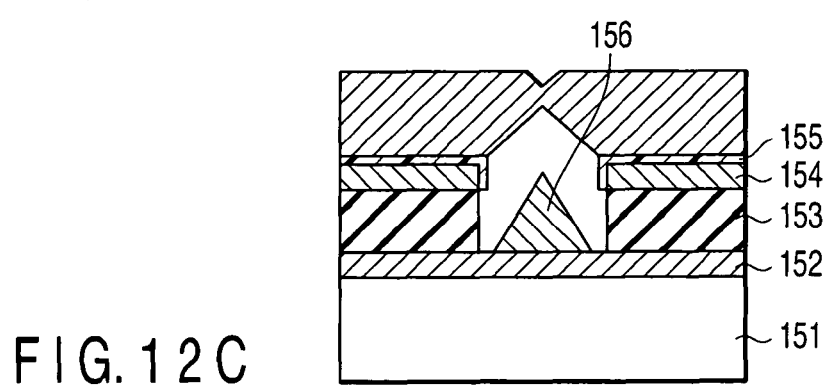

Subsequently, as shown in FIG. 12C, by means of the ordinary anisotropic deposition method directed in a direction perpendicular to the substrate 151, a metallic material for forming an emitter 156 was deposited on the surface of the substrate 151. In this case, as the deposition was continued, the pore diameter of the gate hole was gradually caused to narrow and at the same time, a cone-like emitter 156 was formed, in a self-aligned manner, on the surface of the emitter wiring 152. The deposition is continued until the gate hole is ultimately closed. As for the material for the emitter, it is possible to employ Mo, Ni, etc.

Figure 12D:
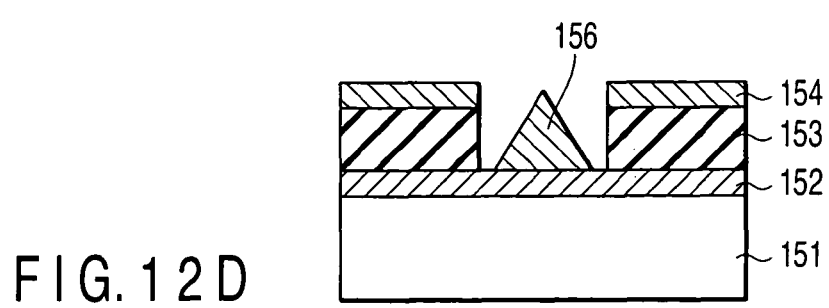

Then, as shown in FIG. 12D, the lift-off material 155 is etched away and the gate electrode 154 is patterned as required.

Finally, by making use of a microwave plasma CVD apparatus, a nano-crystal diamond film 157 was formed.

The conditions for the microwave plasma CVD were as follows.

Raw gas: methane (flow rate: 2 sccm) and hydrogen (flow rate: 18 sccm)

Doping gas: hydrogen sulfide (0.01 to 5 vol % based on the raw gas)

Temperature of substrate: 300° C.

Reaction pressure: 5 Torr

MW power: 500 W

By means of the microwave plasma CVD and under the aforementioned conditions, a nano-crystal diamond film 157 having a thickness of 30 μm was formed. Upon finishing the formation of the film, the surface of the nano-crystal diamond film 157 was subjected to a hydrogen plasma treatment for 5 minutes.

As a result, it was possible to create a hydrogen-terminated surface structure on the surface of the nano-crystal diamond film formed on the emitter. This hydrogen-terminated surface structure was analyzed by means of FT-IR method to confirm a C—H structure. Further, when the surface potential of the hydrogen-terminated surface was measured and reduced by making use of a Kelvin probe microscope (KFM), it was found possible to obtain a high surface work function of as high as 2.8 eV.

Figure 12E:
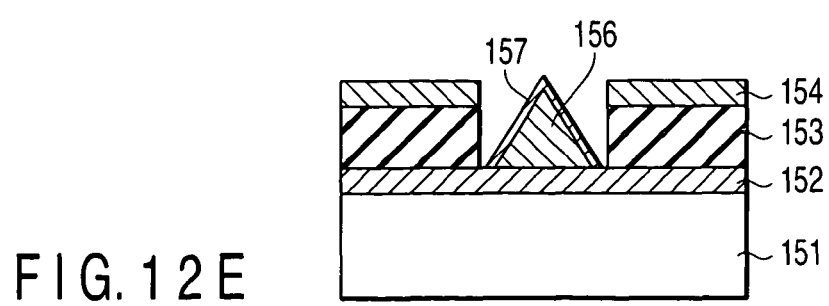

Subsequently, a redundant portion of the nano-crystal diamond film was removed, thus accomplishing the manufacture of a cold electron-releasing device as shown in FIG. 12E.

Example 12

One example wherein the nano-crystal diamond film was applied to an electrode catalyst for use in a fuel cell will be explained with reference to FIG. 10.

A nano-crystal diamond film 112 of the present invention was formed, as a cathode 110, on the surface of carbon paper having a thickness of 100 μm and formed of fibers having a diameter of 10 μm. An average crystal grain diameter of the nano-crystal diamond film 112 in this case was limited to about 1 to 2 nm and at most to 5 nm.

By means of a dipping method, fine platinum particles were allowed to carry on an electrode material having this nano-crystal diamond precipitated on the surface thereof. More specifically, an aqueous alkaline solution comprising an aqueous solution of platinic chloride ($H_2PtCl_6$) which was conditioned by the addition of sodium hydrogencarbonate was gradually dropped on the surface of the nano-crystal diamond film 112, thereby allowing fine particles of platinum hydroxide ($Pt(OH)_4$) to precipitate thereon. This electrode material was then reduced in a hydrogen gas stream at a temperature ranging from 100 to 700° C., thus enabling the electrode material to be employed as the cathode 110.

Likewise, as for an anode 111, there was employed an electrode material comprising a nano-crystal diamond film 113 formed on the surface of carbon paper having a thickness of 100 μm and formed of fibers having a diameter of 10 μm. By means of a dipping method, fine particles of 30 wt % Pt—Rh alloy could be carried on the surface of nano-crystal diamond film 113, thus obtaining the anode 111.

An electrolyte film 114 (having a thickness of 150-200 μm, for example) formed of a fluorinated resin having sulfonic acid (for example, Nafion 117; Du Pont Co., Ltd.) was sandwiched between the cathode 110 and the anode 111 both provided with the aforementioned the nano-crystal diamond film 112 and the nano-crystal diamond film 113, respectively. The resultant composite body was formed into an integral body at a temperature of 100° C. and at a pressure of 100 atm, thus manufacturing a fuel cell as shown in FIG. 10.

A liquid fuel consisting of a mixture comprising methanol and water was fed to the anode 111 of a fuel cell (for example, 10 $cm^2$ in electrode area) thus obtained, while dry air was fed to the cathode 110, thus enabling the fuel cell to generate electric energy. The temperature for the power generation was set to 60° C. As a result, it was possible to obtain an output power of 70 W/$cm^2$. When the temperature for the power generation was set to 70° C., it was possible to obtain an output power of 100 W/$cm^2$.

Example 13

One example wherein the nano-crystal diamond film was applied to a catalyst will be explained.

First of all, a solution comprising a metal salt functioning as a catalyst, and a solvent for the metal salt was prepared. Then, the nano-crystal diamond film obtained in the same manner as described above was dipped into this solution. After dipping the nano-crystal diamond film for a suitable period of time, the solvent was allowed to evaporate with the nano-crystal diamond film being kept dipped in the solution. As a result, the catalytic metal atoms were allowed to adhere onto the surface of the nano-crystal diamond film at a high dispersion, thus obtaining a precursor of a catalyst.

Then, this catalyst precursor was sintered in an inert gas atmosphere or air atmosphere. When the sintering is to be performed in an air atmosphere, the conditions thereof should preferably be 400-800° C. in temperature and 3-5 hours in sintering time. When the sintering temperature is lower than 400° C., residual impurity such as nitric acid cannot be sufficiently removed, thus preventing or deteriorating the development of catalytic activity. The sintering temperature may be increased up to about 800° C. However, when the sintering temperature exceeds 800° C., the nano-crystal diamond film may react with the catalytic metal to create graphite consisting of the catalytic metal and carbon, thus undesirably destroying the catalytic activity thereof.

Then, this catalyst precursor was subjected to a reduction treatment for imparting a catalytic activity to this catalyst precursor. This reduction treatment can be performed in a reducing gas atmosphere, e.g. in a flow of a reducing gas such as hydrogen gas. The reducing temperature should preferably be selected from the range of 300 to 500° C. If the reducing temperature is lower than 300° C., it may be impossible to sufficiently reduce the metal. On the other hand, if the reducing temperature is higher than 800° C., part of the nano-crystal diamond film may be permitted to react with the catalytic metal to create graphite consisting of the catalytic metal and carbon, thus undesirably destroying the catalytic activity thereof.

As for the catalytic metal, it is possible to employ nickel, cobalt, iron, ruthenium, rhodium, palladium, iridium, platinum or a combination thereof.

Specifically, a nano-crystal diamond film having crystal grains of about 8 nm was employed as a carrier, and nickel was employed as a catalytic metal. Then, a metal-carrying nano-crystal diamond catalyst was manufactured as follows.

A prescribed quantity of a nano-crystal diamond film was immersed in a saturated aqueous solution of nickel nitrate and left to stand overnight. Thereafter, water was allowed to evaporate to obtain dried catalyst precursor, which was then sintered in a nitrogen gas atmosphere at a temperature ranging from 400° C. to 500° C., thus removing nitric acid and residual nickel nitrate and obtaining a metal-carrying nano-crystal diamond catalyst.

What is claimed is:

1. A method for manufacturing a nano-crystal diamond film, the method comprising:
    forming a nano-crystal diamond film on a substrate by means of a plasma CVD method using a raw material gas comprising hydrocarbon, hydrogen, and at least one additive gas selected from the group consisting of hydrogen sulfide, carbon dioxide and oxygen, the substrate being placed outside a plasma region and downstream of the raw material gas flow from the plasma region, the nano-crystal diamond film containing at least one impurity selected from the group consisting of sulfur, boron and oxygen doped with a concentration of $10^{16}$ to $10^{21}/cm^3$, not less than 80% of crystal grains in the nano-crystal diamond film being constituted by crystal grains having a grain diameter ranging from 1 nm to not more than 1000 nm; and
    subjecting the nano-crystal diamond film to a hydrogen plasma treatment using microwave or high-frequency power or a chlorinated gas plasma treatment using microwave or high-frequency power to terminate a surface of the nano-crystal diamond film with hydrogen atoms or chlorine atoms.

2. The method for manufacturing a nano-crystal diamond film according to claim 1, wherein the forming of nano-crystal diamond film is carried out by setting the temperature of the substrate to be within a range of 20° C. to 900° C.

3. The method for manufacturing a nano-crystal diamond film according to claim 1, wherein the forming of a nano-crystal diamond film is carried out by means of a microwave plasma CVD method.

4. The method for manufacturing a nano-crystal diamond film according to claim 1, wherein the substrate is selected from the group consisting of a silicon substrate, a quartz substrate, a ceramic substrate, a metal substrate, a glass substrate and a polymer substrate.

5. A method comprising:
    forming one or more pairs of electrodes;
    detecting the identity of a test substance to be measured by utilizing a redox reaction of a surface of the electrodes and measuring a concentration of the test substance, wherein at least one of the electrodes comprises a substrate and a nano-crystal diamond film formed on a surface of the substrate; the nano-crystal diamond film being formed by the method set forth in claim 1.

6. The method according to claim 5, wherein the substrate is a glass substrate or a polymer substrate, and the temperature for forming the nano-crystal diamond film is not higher than 500° C.

7. The method according to claim 5, further comprising:
    patterning the nano-crystal diamond film formed on the surface of the substrate by lithography.

8. A method comprising:
    forming an electrochemical electrode by forming a nano-crystal diamond film manufactured according to claim 1 on a surface of a substrate; and
    employing the electrochemical electrode as an anode and/or a cathode for electrolyzing liquid or gas by utilizing an electrochemical reaction.

9. The method according to claim 8, wherein the substrate is a glass substrate or a polymer substrate, and the temperature for forming the nano crystal diamond film is not higher than 500° C.

10. The method according to claim 8, further comprising:
    patterning the nano-crystal diamond film formed on the surface of the substrate by lithography.

11. A method for manufacturing a DNA chip comprising:
    forming a nano-crystal diamond film by a method selected from the methods set forth in claims 1 and 2 to 4;
    treating a surface of the nano-crystal diamond film to attach thereto a functional group for carrying DNA; and
    applying a DNA probe to the surface of the nano-crystal diamond film to enable the surface of nano-crystal diamond film to carry the DNA probe thereon.

12. The method for manufacturing a DNA chip according to claim 11, wherein the substrate is a glass substrate or a polymer substrate, and the temperature for forming the nano-crystal diamond film is not higher than 500° C.

13. The method for manufacturing a DNA chip according to claim 11, which further comprises patterning the nano-crystal diamond film formed on the substrate by lithography.

14. A method for manufacturing an organic thin film transistor comprising:
    providing a substrate;
    forming a gate electrode on the substrate, a gate insulating film covering the gate electrode, a source electrode and a drain electrode spaced apart from each other, and an organic semiconductor layer covering the space between the source electrode and the drain electrode; and
    forming a nano-crystal diamond film on a surface of the source electrode and/or the drain electrode by the method set forth in claim 1.

15. A method for manufacturing a cold electron-emission device comprising:
    providing a substrate;
    forming a conductive layer on the substrate;
    forming an insulating layer and a gate electrode on the conductive layer and providing an opening;
    forming an emitter on a portion of the conductive layer which is exposed through the opening; and
    forming a nano-crystal diamond film on a surface of the emitter by the method set forth in claim 1.

16. A method for manufacturing a fuel cell comprising:
    providing a first electrode;
    providing a second electrode;
    providing an electrolyte layer sandwiched between the first electrode and the second electrode;
    forming a nano-crystal diamond film on a side face of the first electrode and/or the second electrode, which is in contact with the electrolyte layer, by the method set forth in claim 1; and
    applying a catalyst to the nano-crystal diamond film, enabling the catalyst to be carried on the nano-crystal diamond film.

17. A method for manufacturing a metal-carrying nano-crystal diamond catalyst, the method comprising:
   forming a nano-crystal diamond film on a substrate by the method set forth in claim 1; and
   applying catalytic metal particles having a particle diameter of the order of nanometers, enabling the metal particles to be carried on the nano-crystal diamond film.

18. A method for manufacturing an organic electroluminescent device comprising:
   successively laminating a first electrode, an organic luminescent layer, and a second electrode on a substrate, wherein
   the first electrode and/or the second electrode is formed as a nano-crystal diamond film by the method set forth in claim 1.

19. A method for manufacturing an organic electroluminescent device comprising:
   successively laminating a first electrode, an organic luminescent layer, and a second electrode on a substrate; and
   forming a nano-crystal diamond film on the first electrode and/or the second electrode by the method set forth in claim 1.

20. A method for manufacturing an organic photoelectric receiving device comprising:
   successively laminating a first electrode, a first conductive organic semiconductor layer, a second conductive organic semiconductor layer and a second electrode on a substrate, wherein
   the first electrode and/or the second electrode is formed as a nano-crystal diamond film by the method set forth in claim 1.

21. A method for manufacturing an organic photoelectric receiving device comprising:
   successively laminating a first electrode, a first conductive organic semiconductor layer, a second conductive organic semiconductor layer and a second electrode on a substrate; and
   forming a nano-crystal diamond film on the first electrode and/or the second electrode by the method set forth in claim 1.

* * * * *